United States Patent
Kotani et al.

(10) Patent No.: US 9,387,608 B2
(45) Date of Patent: *Jul. 12, 2016

(54) THERMOSETTING RESIN COMPOSITION FOR LIGHT REFLECTION, METHOD FOR MANUFACTURING THE RESIN COMPOSITION AND OPTICAL SEMICONDUCTOR ELEMENT MOUNTING SUBSTRATE AND OPTICAL SEMICONDUCTOR DEVICE USING THE RESIN COMPOSITION

(75) Inventors: Hayato Kotani, Tsukuba (JP); Naoyuki Urasaki, Chikusei (JP); Kanako Yuasa, Saitama (JP); Akira Nagai, Hitachi (JP); Mitsuyoshi Hamada, Abiko (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 8 days.

This patent is subject to a terminal disclaimer.

(21) Appl. No.: 12/515,182

(22) PCT Filed: Nov. 14, 2007

(86) PCT No.: PCT/JP2007/072069
§ 371 (c)(1), (2), (4) Date: May 15, 2009

(87) PCT Pub. No.: WO2008/059856
PCT Pub. Date: May 22, 2008

(65) Prior Publication Data
US 2010/0140638 A1 Jun. 10, 2010

(30) Foreign Application Priority Data

Nov. 15, 2006 (JP) ................ P2006-309052
Apr. 4, 2007 (JP) ................ P2007-098354

(51) Int. Cl.
| | | |
|---|---|---|
| C08K 3/22 | (2006.01) | |
| C08K 7/24 | (2006.01) | |
| C08K 7/28 | (2006.01) | |
| C08L 63/02 | (2006.01) | |
| C08L 63/06 | (2006.01) | |
| B29C 45/02 | (2006.01) | |
| C08K 3/00 | (2006.01) | |
| C08L 63/00 | (2006.01) | |
| B29C 45/00 | (2006.01) | |
| C08G 59/40 | (2006.01) | |
| C08G 59/42 | (2006.01) | |
| B29L 11/00 | (2006.01) | |
| H01L 33/48 | (2010.01) | |
| H01L 33/60 | (2010.01) | |

(52) U.S. Cl.
CPC .............. *B29C 45/02* (2013.01); *B29C 45/0001* (2013.01); *C08G 59/4014* (2013.01); *C08G 59/4215* (2013.01); *C08K 3/0033* (2013.01); *C08K 3/2279* (2013.01); *C08K 7/24* (2013.01); *C08K 7/28* (2013.01); *C08L 63/00* (2013.01); *C08L 63/06* (2013.01); *B29L 2011/00* (2013.01); *C08K 2003/222* (2013.01); *C08K 2003/2227* (2013.01); *C08K 2003/2241* (2013.01); *C08K 2003/2244* (2013.01); *H01L 33/486* (2013.01); *H01L 33/60* (2013.01); *H01L 2224/16245* (2013.01); *H01L 2224/48091* (2013.01); *H01L 2224/48247* (2013.01)

(58) Field of Classification Search
None
See application file for complete search history.

(56) References Cited

U.S. PATENT DOCUMENTS

| | | | | |
|---|---|---|---|---|
| 4,798,762 | A * | 1/1989 | Okada et al. ............... | 428/300.7 |
| 5,171,769 | A * | 12/1992 | Bull et al. .................. | 523/447 |
| 5,189,080 | A * | 2/1993 | Heyke et al. ............... | 523/212 |
| 6,096,812 | A * | 8/2000 | Hanafin et al. ............. | 524/100 |
| 6,924,596 | B2 | 8/2005 | Sato et al. | |
| 6,960,878 | B2 | 11/2005 | Sakano et al. | |
| 7,098,258 | B2 * | 8/2006 | Ideno et al. ............... | 522/170 |

(Continued)

FOREIGN PATENT DOCUMENTS

| | | |
|---|---|---|
| CN | 1594426 | 3/2005 |
| CN | 1642385 | 7/2005 |

(Continued)

OTHER PUBLICATIONS

Derwent accession No. 2005-140393 for Japanese Patent No. 2005-36218, Ideno et al., Feb. 10, 2005, three pages.*

(Continued)

*Primary Examiner* — Robert Sellers
(74) *Attorney, Agent, or Firm* — Fitch, Even, Tabin & Flannery, LLP

(57) ABSTRACT

This invention provides a heat curable resin composition for light reflection, which, after curing, can realize high reflectance in a range of visible light to near ultraviolet light, has excellent heat deterioration resistance and tablet moldability, and is less likely to cause burrs during transfer molding, and a process for producing the resin composition, and an optical semiconductor element mounting substrate and an optical semiconductor device using the resin composition. The heat curable resin composition for light reflection comprises a heat curable component and a white pigment and is characterized in that the length of burrs caused upon transfer molding under conditions of molding temperature 100° C. to 200° C., molding pressure not more than 20 MPa, and molding time 60 to 120 sec is not more than 5 mm and the light reflectance after heat curing at a wavelength of 350 nm to 800 nm is not less than 80%. The resin composition can be used for constructing the optical semiconductor element mounting substrate and the optical semiconductor device.

20 Claims, 5 Drawing Sheets

(56) References Cited

U.S. PATENT DOCUMENTS

| | | | |
|---|---|---|---|
| 8,188,165 B2* | 5/2012 | Elgimiabi et al. | 523/400 |
| 8,785,525 B2* | 7/2014 | Kotani et al. | 523/458 |
| 2002/0004111 A1* | 1/2002 | Matsubara et al. | 428/34.4 |
| 2002/0016411 A1* | 2/2002 | Ando et al. | 525/100 |
| 2002/0117774 A1 | 8/2002 | Shimada | |
| 2003/0153650 A1 | 8/2003 | Tada | |
| 2004/0165390 A1* | 8/2004 | Sato et al. | 362/341 |
| 2006/0153981 A1* | 7/2006 | Husemann et al. | 427/208.4 |
| 2007/0072981 A1 | 3/2007 | Miller | |
| 2010/0104794 A1* | 4/2010 | Aoki et al. | 428/76 |
| 2010/0140638 A1* | 6/2010 | Kotani et al. | 257/98 |
| 2010/0155739 A1* | 6/2010 | Kuramoto et al. | 257/76 |

FOREIGN PATENT DOCUMENTS

| | | |
|---|---|---|
| CN | 1670076 A | 9/2005 |
| JP | 63-130620 | 6/1988 |
| JP | 63-130623 | 6/1988 |
| JP | 04-059863 | 2/1992 |
| JP | 4-59863 A * | 2/1992 |
| JP | 04-231355 | 8/1992 |
| JP | 05-239321 | 9/1993 |
| JP | 06-107767 | 4/1994 |
| JP | 06-132427 A | 5/1994 |
| JP | 06-209024 | 7/1994 |
| JP | 6-209024 A * | 7/1994 |
| JP | 07-216196 | 8/1995 |
| JP | 8-104796 | 4/1996 |
| JP | 8-193122 | 7/1996 |
| JP | 8193122 | 7/1996 |
| JP | 08-245214 | 9/1996 |
| JP | 08-245755 | 9/1996 |
| JP | 8-245755 A * | 9/1996 |
| JP | 09-167860 | 6/1997 |
| JP | 09-235452 | 9/1997 |
| JP | 10-182944 | 7/1998 |
| JP | 10-292094 | 11/1998 |
| JP | 11-124504 | 5/1999 |
| JP | 11-166105 A | 6/1999 |
| JP | 11-302499 | 11/1999 |
| JP | 11-340517 | 12/1999 |
| JP | 2000-169557 | 6/2000 |
| JP | 2000-191890 | 7/2000 |
| JP | 2000323756 A | 11/2000 |
| JP | 2001024228 A | 1/2001 |
| JP | 2001-118969 | 4/2001 |
| JP | 2001-158614 | 6/2001 |
| JP | 2001-220496 | 8/2001 |
| JP | 2001-358493 | 12/2001 |
| JP | 2002179807 | 6/2002 |
| JP | 2003124523 A | 4/2003 |
| JP | 2003-171531 | 6/2003 |
| JP | 2003-218399 | 7/2003 |
| JP | 2003-224305 | 8/2003 |
| JP | 2004-224992 | 8/2004 |
| JP | 2005-036218 | 2/2005 |
| JP | 2005-053978 | 3/2005 |
| JP | 2005-089710 | 4/2005 |
| JP | 2005-136378 | 5/2005 |
| JP | 2005-171119 | 6/2005 |
| JP | 2006-036915 | 2/2006 |
| JP | 2006-140207 | 6/2006 |
| JP | 2006-140207 A * | 6/2006 |
| JP | 2006-156704 | 6/2006 |
| JP | 2006140207 | 6/2006 |
| JP | 2006173498 | 6/2006 |
| JP | 2006-176678 | 7/2006 |
| JP | 2006-182961 | 7/2006 |
| JP | 2006-193570 | 7/2006 |
| JP | 2006-241353 | 9/2006 |
| JP | 2006-265370 | 10/2006 |
| JP | 2006-306985 A * | 11/2006 |
| JP | 2007-129173 | 5/2007 |
| JP | 2007-129173 A * | 5/2007 |
| JP | 2007-514009 | 5/2007 |
| JP | 2007-235085 | 9/2007 |
| JP | 2007-284596 | 11/2007 |
| JP | 2007-297601 | 11/2007 |
| JP | 2008-050573 | 3/2008 |
| JP | 2008-106226 | 5/2008 |
| JP | 2008-144127 | 6/2008 |
| JP | 2001111119 A | 5/2016 |
| KR | 10-2005-0002668 | 1/2005 |
| TW | 553971 | 9/2003 |
| TW | 574245 | 2/2004 |
| TW | 200617054 | 6/2006 |
| WO | WO 9903903 | 1/1999 |
| WO | WO 2005/042630 | 5/2005 |
| WO | WO 2005/042630 A2 | 5/2005 |
| WO | WO 2005/121202 | 12/2005 |
| WO | WO 2006/071820 A1 * | 7/2006 |
| WO | WO 2007/015426 A1 | 2/2007 |
| WO | WO 2007/015427 A1 | 2/2007 |
| WO | WO 2008/059856 A1 * | 5/2008 |

OTHER PUBLICATIONS

Derwent accession No. 2007-254914 for PCT Publication No. 2007/015426 A1, Kuramoto et al., Feb. 8, 2007, three pages.*
Derwent accession No. 2007-343306 for PCT Publication No. 2007/015427 A1, Aoki et al., Feb. 8, 2007, three pages.*
Korean Official Action dated Jan. 9, 2013, for KR Application No. 10-2011-7013313.
Korean Official Action dated Jan. 9, 2013, for KR Application No. 10-2011-7013314.
Korean Official Action dated Jan. 10, 2013, for KR Application No. 10-2011-7013315.
Korean Official Action dated Jan. 10, 2013, for KR Application No. 10-2011-7013317.
Korean Official Action dated Jan. 11, 2013, for KR Application No. 10-2011-7013316.
3$^{rd}$ Party Request Form of Information Offer, notified to Applicants on Dec. 11, 2012, for JP Application No. JP 2007-176206.
Japanese Official Action dated Jun. 18, 2013, for JP Application No. 2012-060714.
Chinese Official Action dated Apr. 3, 2013, for CN Application No. 201110309967.4.
European Official Action dated Apr. 3, 2013, for EP Application No. 07 831 799.7-1706.
Taiwanese Official Action dated May 20, 2013, for TW Application No. 096143251.
Office action in connection with corresponding foreign Chinese Application No. 201210230392.1, dated Apr. 9, 2014.
Japanese Office Action issued Apr. 14, 2015, in connection with Japanese Patent Application No. 2012-60714, and English translation thereof.
Taiwanese Office Action issued May 7, 2015, in connection with Taiwanese Application No. 102130851 and English translation thereof.
Taiwanese Office Action issued May 7, 2015, in connection with Taiwanese Application No. 10420596570, and English translation thereof.
Official Action issued Jan. 27, 2015, in counterpart Japanese Patent Application No. 2012-60714.
Official Action issued Mar. 3, 2015, in counterpart Japanese Patent Application No. 2014-103155.
Taiwanese Official Action dated Sep. 23, 2014, for TW Application No. 102130851.
Notice of Reasons for Refusal mailed Sep. 29, 2015 for counterpart Japanese Application No. 2014-103155, together with English language translation thereof.
Office Action mailed Jun. 26, 2015, for Taiwanese Application No. 103144202, together with English translation thereof; 7 pages.
Office Action issued Nov. 17, 2015, by the Japan Patent Office in regards to Appln. No. 2014-245646.
Office Action mailed May 10, 2016, by the Japan Patent Office in regards to Japanese Application No. 2014-103155.

* cited by examiner (a)

(b)

(a)

(b)

(a)

(b)

THERMOSETTING RESIN COMPOSITION FOR LIGHT REFLECTION, METHOD FOR MANUFACTURING THE RESIN COMPOSITION AND OPTICAL SEMICONDUCTOR ELEMENT MOUNTING SUBSTRATE AND OPTICAL SEMICONDUCTOR DEVICE USING THE RESIN COMPOSITION

TECHNICAL FIELD

The present invention relates to a thermosetting resin composition for light reflection used in an optical semiconductor device that combines an optical semiconductor element and a wavelength conversion means such as a phosphor, and also relates to a method for manufacturing the resin composition, and to an optical semiconductor element mounting substrate and optical semiconductor device using the resin composition.

BACKGROUND

Optical semiconductor devices that combine an optical semiconductor element such as an LED (light-emitting diode) with a phosphor are advantageous in terms of, for instance, high energy efficiency and long life. Accordingly, there is growing demand for such optical semiconductor devices in all manner of applications including outdoor displays, portable liquid crystal backlights and vehicle on-board applications. This trend has been accompanied by problems such as rising junction temperatures on account of greater heat output in the elements, or deterioration of element materials caused by the increase in direct light energy, as the luminance of such LED devices grows ever higher. The development of element materials having resistance to thermal degradation and light degradation has become thus an issue in recent years. Japanese Unexamined Patent Application Publication No. 2006-140207 discloses an optical semiconductor element mounting substrate having excellent reflectance characteristics after heat resistance testing.

When manufacturing a substrate by transfer molding using the thermosetting resin composition for light reflection disclosed in the above patent document, however, resin contamination occurs readily in that the resin composition seeps through gaps between the upper and lower dies of the mold during molding. When resin contamination occurs during heat molding, the contamination gets into the opening (recess) in the substrate that constitutes the optical semiconductor element mounting region, and hinders thereby mounting of the optical semiconductor element. Even if the optical semiconductor element can be mounted in the opening, such resin contamination obstructs electrical connection of the optical semiconductor element and metal wiring, effected by way of wire bonding or the like. That is, resin contamination is undesirable in that it impairs workability in element mounting and wire bonding during manufacture of a semiconductor element. When resin contamination is present at the opening of a substrate, a step of removing resin contamination is normally added to the manufacturing processes of optical semiconductor element mounting substrates, in such a manner so as to prevent the above-described hindrances during semiconductor element manufacturing. Owing to the cost and manufacturing time loss incurred, however, such removal step is still open to improvement.

DISCLOSURE OF THE INVENTION

In the light of the above, the present invention provides a thermosetting resin composition for light reflection having high reflectance after curing, from visible light to near infrared, and not prone to give rise to resin contamination during transfer molding. Also, the present invention provides a semiconductor element mounting substrate and an optical semiconductor device, using the above resin composition, that have excellent wire bondability and resistance to light degradation and thermal degradation. Further, the present invention provides a manufacturing method for manufacturing efficiently the optical semiconductor element mounting substrate and optical semiconductor device.

Specifically, the characterizing features of the invention include features (1) to (26) set forth below.

(1) A thermosetting composition for light reflection comprising a thermosetting resin component and a white pigment (E), wherein the length of burrs generated during transfer molding, under conditions of a molding temperature of 100° C. to 200° C., a molding pressure of not greater than 20 MPa and a molding time of from 60 to 120 seconds, is not greater than 5 mm; and light reflectance at a wavelength of 350 nm to 800 nm, after thermal curing, is not lower than 80%.

(2) The thermosetting resin composition for light reflection according to (1) wherein the thermosetting component contains an epoxy resin (A).

(3) The thermosetting resin composition for light reflection according to (2) wherein the epoxy resin (A) is obtained by kneading an epoxy resin (A') and a curing agent (B'), and contains an oligomer (G) having a viscosity of range from 100 to 2500 mPa·s at 100 to 150° C.

(4) The thermosetting resin composition for light reflection according to (3), wherein the thermosetting component further contains a curing agent (B) used together with the epoxy resin (A), and the blending ratio of the epoxy resin (A) and the curing agent (B) is a ratio of 0.5 to 0.7 equivalents of active groups, capable of reacting with the epoxy groups in the curing agent (B), relative to 1 equivalent of epoxy groups in the epoxy resin (A).

(5) The thermosetting resin composition for light reflection according to (4) wherein the curing agent (B) contains a compound having an isocyanuric acid backbone.

(6) The thermosetting resin composition for light reflection according to (5) wherein the curing agent (B) further contains an acid anhydride having a melting point of not lower than 35° C.

(7) The thermosetting resin composition for light reflection according to (4) wherein the curing agent (B) contains cyclohexanetricarboxylic anhydride.

(8) The thermosetting resin composition for light reflection according to (7) wherein the above cyclohexanetricarboxylic anhydride is a compound represented by structural formula (1) below.

[Formula 1]

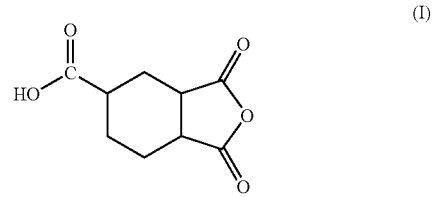

(I)

(9) The thermosetting resin composition for light reflection according to any of (1) to (8), further containing a thickener (H), wherein the thickener (H) contains a nanoparticle filler having a median particle size of 1 nm to 1000 nm.

(10) The thermosetting resin composition for light reflection according to any one of (1) to (8), further containing an inorganic filler (D), wherein the inorganic filler (D) contains a porous filler or a compound having oil absorption capacity.

(11) The thermosetting resin composition for light reflection according to (10) wherein the shape of the porous filler or compound having oil absorption capacity is at least one selected from the group consisting of a perfect spherical shape, an irregular shape, a disc-like shape, a rod shape and a fibrous shape.

(12) The thermosetting resin composition for light reflection according to (10) or (11), wherein a surface of the porous filler or compound having oil absorption capacity is subjected to a hydrophobization treatment or a hydrophilization treatment.

(13) The thermosetting resin composition for light reflection according to any one of (10) to (12), wherein the apparent density of the porous filler or compound having oil absorption capacity is not lower than 0.4 $g/cm^3$.

(14) The thermosetting resin composition for light reflection according to any of (10) to (13), wherein the content of the porous filler or compound having oil absorption capacity in the inorganic filler (D) ranges from 0.1 vol % to 20 vol %.

(15) The thermosetting resin composition for light reflection according to any of (1) to (14), further containing, as the inorganic filler (D), at least one selected from the group consisting of silica, aluminum hydroxide, magnesium hydroxide, barium sulfate, magnesium carbonate and barium carbonate.

(16) The thermosetting resin composition for light reflection according to any of (1) to (15), wherein the white pigment (E) is at least one selected from the group consisting of alumina, magnesium oxide, antimony oxide, titanium oxide, zirconium oxide and inorganic hollow particles.

(17) The thermosetting resin composition for light reflection according to any of (1) to (16), wherein the median particle size of the white pigment (E) ranges from 0.1 to 50 μm.

(18) The thermosetting resin composition for light reflection according to any of (1) to (17), wherein the total blending amount of the inorganic filler (D) and the white pigment (E) ranges from 10 vol % to 85 vol % relative to total resin composition.

(19) The thermosetting resin composition for light reflection according to any one of (1) to (18), containing at least a kneaded product obtained under a condition where the above constituent components are kneaded at a kneading temperature of 20 to 100° C. for a kneading time of 10 to 30 minutes.

(20) The thermosetting resin composition for light reflection according to (19) wherein the kneaded product is aged at 0 to 30° C. for 1 to 72 hours after the kneading.

(21) A method for manufacturing the thermosetting resin composition for light reflection according to any one (1) to (20), comprising the steps of: kneading at least components of the resin composition to form a kneaded product; and aging the kneaded product at 0 to 30° C. for 1 to 72 hours.

(22) The method for manufacturing a thermosetting resin composition for light reflection according to (21), wherein the kneading step is carried out under a condition where a kneading temperature is 20 to 100° C., and the kneading is performed for 10 to 30 minutes.

(23) An optical semiconductor element mounting substrate, characterized by being formed in use of the thermosetting resin composition for light reflection according to any of (1) to (20).

(24) An optical semiconductor element mounting substrate having one or more recesses that provide an optical semiconductor element mounting region; wherein at least an inner peripheral side face of the recess comprises the thermosetting resin composition for light reflection according to any of (1) to (20).

(25) A method for manufacturing an optical semiconductor element mounting substrate having one or more recesses that provide an optical semiconductor element mounting region, the method comprising: forming at least the recess by transfer molding with the thermosetting resin composition for light reflection according to any of (1) to (20).

(26) An optical semiconductor element, comprising at least the optical semiconductor element mounting substrate according to (24); an optical semiconductor element mounted on a recess bottom face of the optical semiconductor element mounting substrate; and a phosphor-containing transparent encapsulating resin layer formed in the recess so as to cover the optical semiconductor element.

This application is based on and claims priority to Japanese Patent Application No. 2006-309052, filed on 15 Nov. 2006, and Japanese Patent Application No. 2007-098354, filed on 4 Apr. 2007, the descriptions of which are partially incorporated herein by reference.

BEST MODE FOR CARRYING OUT THE INVENTION

Embodiments of the present invention are explained below. The thermosetting resin composition for light reflection of the present invention comprises a thermosetting resin component and a white pigment. The length of burrs generated during transfer molding is no greater than 5 mm under molding conditions employed during actual molding, for instance a molding temperature of 100° C. to 200° C., a molding pressure of no greater than 20 MPa and a molding time of from 60 to 120 seconds. Moreover, light reflectance at a wavelength of 350 nm to 800 nm, after thermal curing, is not lower than 80%.

Figure 4:
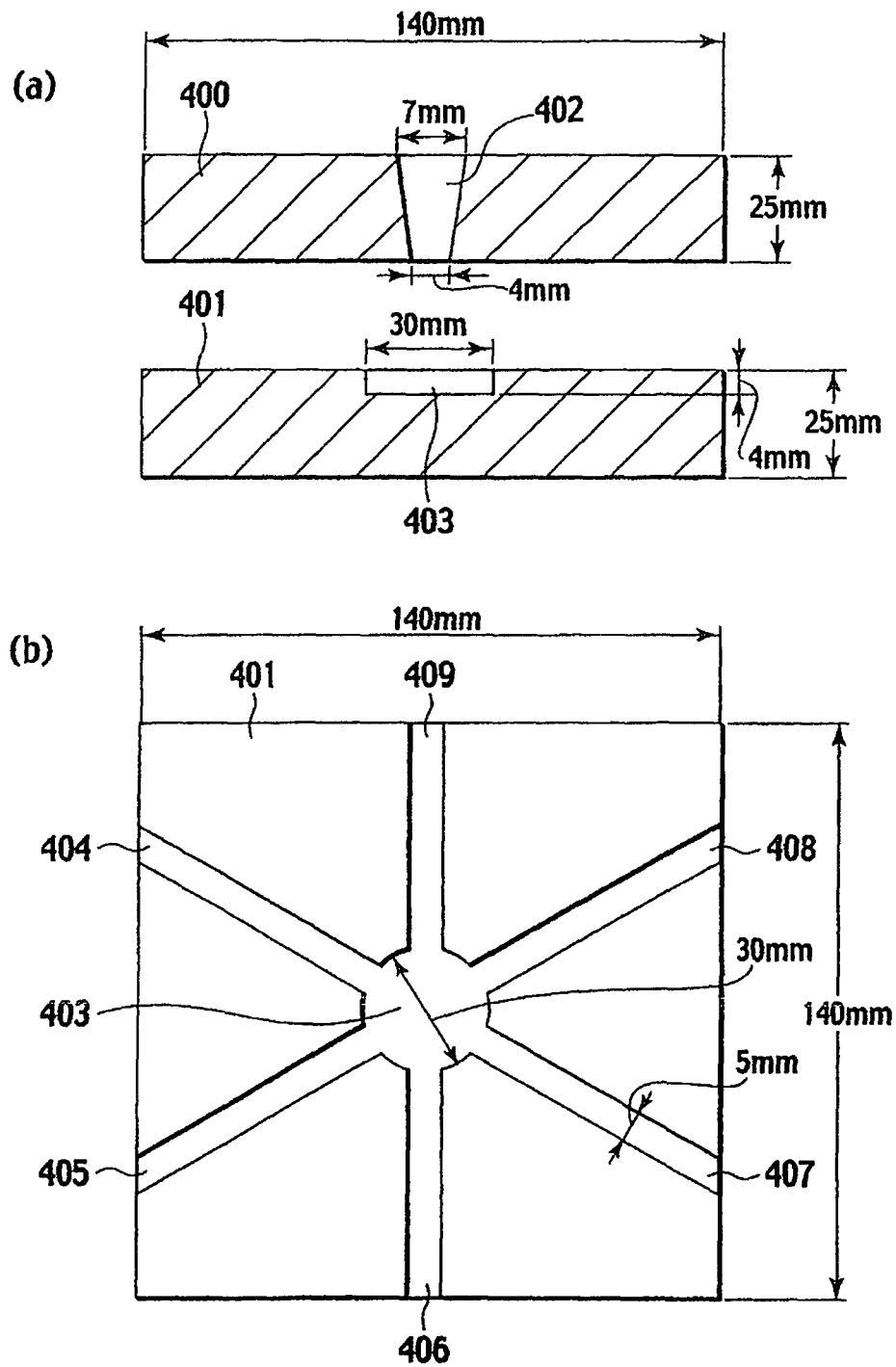
FIG. 4(a) is a side-view cross-sectional diagram and FIG. 4(b) is a plan-view diagram illustrating schematically a mold for burr measurement used in an example.

As used in the present invention, the term "burr length during molding" denotes the largest length of resin cured product that juts in the radial direction out of a cavity in the center of a mold, through gaps at the joint between the upper die and the lower die of the mold, when carrying out transfer molding using the mold for burr measurement illustrated in FIG. 4. When the length of such burrs exceeds 5 mm, resin contamination may get into the opening (recess) in the substrate that constitutes the optical semiconductor element mounting region, and may hinder mounting of the optical semiconductor element. Alternatively, such resin contamination may obstruct electrical connection of the optical semiconductor element and metal wiring, effected by way of wire bonding or the like. From the viewpoint of workability during semiconductor device manufacturing, the burr length of the resin composition of the present invention is preferably no greater than 3 mm, more preferably no greater than 1 mm.

With adequacy for transfer molding in mind, the curable resin composition for light reflection of the present invention is preferably capable of being pressure-molded at room temperature (0 to 30° C.) prior to thermal curing. More specifically, the resin composition should be moldable, for instance, at room temperature, from 5 to 50 MPa, over about 1 to about 5 seconds. From the viewpoint of usage in an optical semiconductor device, light reflectance at a wavelength of 350 nm to 800 nm, after thermal curing, is preferably not lower than 80%, more preferably not lower than 90%. When light reflectance is less than 80%, the resin composition may fail to sufficiently contribute to increasing luminance of the optical semiconductor device.

An explanation follows next on the main constituent components of the thermosetting resin composition for light reflection of the present invention.

In an embodiment of the present invention, an epoxy resin (A) is preferably comprised as a thermosetting resin component. The epoxy resin (A) is not particularly limited, and there may be employed resins ordinarily used as epoxy resin molding materials. Examples thereof include, for instance, epoxidation products of a novolac resin of a phenol and an aldehyde, such as phenol novolac epoxy resins and ortho-cresol novolac epoxy resins; diglycidyl ethers such as bisphenol A, bisphenol F, bisphenol S or alkyl-substituted biphenols; glycidylamine-type epoxy resins obtained by reacting epichlorohydrin with a polyamine such as diaminodiphenylmethane or isocyanuric acid; linear aliphatic epoxy resins obtained through oxidation of olefinic bonds with a peroxyacid such as peracetic acid; and alicyclic epoxy resins. These may be used singly or in combinations of two or more. Preferably, the epoxy resin used is colorless or comparatively uncolored, being for instance of pale yellow hue. Examples of such epoxy resins include, for instance, bisphenol A epoxy resins, bisphenol F epoxy resins, bisphenol S epoxy resins, diglycidyl isocyanurate or triglycidyl isocyanurate.

In an embodiment of the present invention, preferably, an oligomer (G) having a viscosity of range from 100 to 2500 mPa·s at 100 to 150° C. is preferably used as the epoxy resin (A). When the melt viscosity of the resin composition after kneading is low and fluidity excessively high, the air vents of the molding mold may become clogged, and there may remain air and/or volatile components in the mold cavity. Residual air and volatile components in the cavity give rise to appearance problems such as mold voids and weld marks. As the number of molding operations increases, the monomer components remaining on the cured product surface become adhered to the molding mold, contaminating the latter. The accumulation of monomers adhered to the mold ends up impairing releasability of the molded product from the mold, and is hence problematic. In the present invention, by contrast, fluidity can be reduced through an increase in the melt viscosity of the resin composition after kneading, by using an oligomer (G) having a specific viscosity. Using such an oligomer (G) allows thus reducing the residual monomer component that gives rise to mold fouling. As a result, problems that arise when melt viscosity is low are avoided, transfer moldability of the resin composition is enhanced, and there can be obtained a molded product having excellent appearance.

The oligomer (G) used in the present invention is prepared by blending at least an epoxy resin (A') and a curing agent (B'), and also a curing accelerator (C'), as the case may require, prior to the preparation of the curable resin composition for light reflection. As the epoxy resin (A'), the curing agent (B') and the curing accelerator (C') there may be used, respectively, the same epoxy resin (A) described above, and the same curing agent (B) and curing accelerator (C) described below.

More specifically, the oligomer (G) can be obtained by a step of blending for instance the epoxy resin (A') and the curing agent (B') such that relative to 1 equivalent of epoxy groups in the epoxy resin (A') there are no more than 0.3 equivalents of active groups (acid anhydride groups or hydroxyl groups), capable of reacting with the epoxy groups, in the curing agent (B'), followed by kneading to clay-like consistency. Preferably, the obtained clay-like kneaded product is subjected next to an aging process at a temperature of 25 to 60° C. for 1 to 6 hours. When using the curing accelerator (C'), the latter is preferably blended in an amount of range from 0.005 to 0.05 parts by weight relative to 100 parts by weight of the sum of epoxy resin (A') and curing agent (B').

With a view to adjusting burr length during molding to be shorter, the oligomer (G) thus prepared has preferably a viscosity of 100 to 2500 mPa·s at 100 to 150° C. Preferably, the viscosity at 100° C. is 100 to 2500 mPa·s. Burrs are likelier to occur during molding when the viscosity of the oligomer (G) is less than 100 mPa·s. On the other hand, fluidity during molding tends to decrease, and moldability to become impaired, when the viscosity exceeds 2500 mPa·s. The term "viscosity" as used in the description of the present invention denotes a value obtained by measurement using an ICI cone/plate viscometer. The rise in viscosity of the oligomer (G) can be slowed down or stopped through grinding thereof down to a particle size no greater than 1 mm and through storage in an environment at a temperature not higher than 0° C. The oligomer may be ground in accordance with a known method, such as grinding using an earthenware mortar.

In an embodiment of the present invention, the thermosetting resin component comprises the epoxy resin (A) and the curing agent (B). The curing agent (B) is not particularly limited, provided that it is a compound capable of reacting with an epoxy resin. The molecular weight of the curing agent (B) ranges preferably from about 100 to about 400. Preferably, the curing agent (B) is colorless or comparatively uncolored, being for instance of a pale yellow hue. Specific such compounds include, for instance, acid anhydride-based curing agents, isocyanuric acid derivatives and phenolic curing agents.

Preferably, the acid anhydride-based curing agent has a melting point of not lower than 35° C. Examples of such acid anhydrides include, for instance, phthalic anhydride, maleic anhydride, trimellitic anhydride, pyromellitic dianhydride, hexahydrophthalic anhydride, tetrahydrophthalic anhydride, methyl nadic anhydride, nadic anhydride, glutaric anhydride, dimethylglutaric anhydride, diethylglutaric anhydride, succinic anhydride, methylhexahydrophthalic anhydride and methyltetrahydrophthalic anhydride.

Examples of isocyanuric acid derivatives include, for instance, 1,3,5-tris(1-carboxymethyl) isocyanurate, 1,3,5-tris (2-carboxyethyl)isocyanurate, 1,3,5-tris(3-carboxypropyl) isocyanurate, and 1,3-bis(2-carboxyethyl)isocyanurate.

Examples of phenolic curing agents include, for instance, a novolac-type phenolic resin obtained through condensation or co-condensation, in the presence of an acidic catalyst, of a phenol such as phenol, cresol, resorcin, catechol, bisphenol A, bisphenol F, phenyl phenol or amino phenol, and/or a naphthol such as α-naphthol, β-naphthol, dihydroxynaphthalene or the like, with a compound having aldehyde groups such as formaldehyde, benzaldehyde, salicylaldehyde or the like; a phenol aralkyl resin synthesized from a phenol and/or a naphthol and dimethoxyparaxylene or bis(methoxymethyl) biphenyl; an aralkyl-type phenolic resin such as a biphenylene-type phenolic-aralkyl resin, a naphthol-aralkyl resin or the like; a dicyclopentadiene-type phenolic resin such as a dicyclopentadiene-type phenol novolac resin or a dicyclopentadiene-type naphthol novolac resin synthesized from dicyclopentadiene and a phenol and/or a naphthol; a triphenylmethane-type phenolic resin; a terpene-modified phenolic resin; a para-xylylene and/or meta-xylylene modified phenolic resin; a melamine-modified phenolic resin; a cyclopentadiene modified phenolic resin; as well as a phenolic resin obtained by copolymerization of two or more of the foregoing.

Among the curing agents listed above, there is preferably used at least one curing agent from among an acid anhydride selected from the group consisting of phthalic anhydride, trimellitic anhydride, hexahydrophthalic anhydride, tetrahydrophthalic anhydride, methylhexahydrophthalic anhydride, methyltetrahydrophthalic anhydride, glutaric anhydride, dimethylglutaric anhydride, diethylglutaric and cyclohexanetricarboxylic anhydride, and an isocyanuric acid derivative such as 1,3,5-tris(3-carboxypropyl) isocyanurate. These may be used not only singly but also in combinations of two or more.

In an embodiment of the present invention, preferably, at least an isocyanuric acid derivative is used as the curing agent (B). More preferably, the isocyanuric acid derivative is used in combination with an acid anhydride, in particular an acid anhydride having a melting point of not lower than 35° C. The triazine backbone of isocyanuric acid derivatives is characterized by being harder to oxidize by active oxygen than an ordinary cyclic methylene backbone. Therefore, the heat resistance of the resin composition after molding can be enhanced by using an isocyanuric acid derivative, to impart thereby such a characteristic to the resin composition. The mechanical characteristics of moldings can be likewise enhanced thanks to the triazine backbone and the trifunctional reactive groups. Also, combining an isocyanuric acid derivative with an acid anhydride allows increasing the melt viscosity of the resin composition and limiting the length of burrs that jut out of the mold during molding. The blending ratio of isocyanuric acid derivative and acid anhydride can be appropriately adjusted between 1:0 and 1:10. Preferably, the blending ratio ranges from 1:1 to 1:3 from the viewpoint of cutting costs and curtailing loss of reflectance caused by resin yellowing.

In another embodiment of the present invention, at least cyclohexanetricarboxylic anhydride is preferably used as the curing agent (B). Using cyclohexanetricarboxylic anhydride allows increasing the melt viscosity of the resin composition and shortening burr length during molding. The curing time of the resin composition can also be shortened, which in turns allows increasing molding efficiency. Specific examples of cyclohexanetricarboxylic anhydride include compounds represented by structural formula (1) below.

[Formula 2]

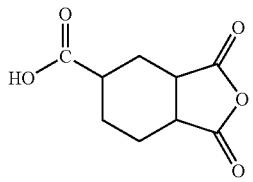

(I)

Other above-described acid anhydride-type, isocyanuric acid derivative-type and phenolic curing agents may also be concomitantly used, together with cyclohexanetricarboxylic anhydride, as the curing agent (B). In terms of fluidity during molding and coloring of the molded product, the concomitantly used curing agent is preferably phthalic anhydride, trimellitic anhydride, hexahydrophthalic anhydride, tetrahydrophthalic anhydride, methylhexahydrophthalic anhydride, methyltetrahydrophthalic anhydride, glutaric anhydride, dimethylglutaric anhydride, diethylglutaric anhydride, or 1,3, 5-tris(3-carboxypropyl) isocyanurate. The content of cyclohexanetricarboxylic anhydride in the curing agent (B) is not particularly limited provided that the purpose of the present invention can be achieved, but is preferably adjusted so as to range from 5 wt % to 100 wt %. From the viewpoint of balancing cost and performance, the content ranges preferably from 25 wt % to 75 wt %.

When the epoxy resin (A) does not contain the oligomer (G), the blending ratio of the epoxy resin (A) and the curing agent (B) is such that relative to 1 equivalent of epoxy groups in the epoxy resin (A) there are preferably 0.5 to 1.5 equivalents, more preferably 0.7 to 1.2 equivalents, of active groups (acid anhydride groups or hydroxyl groups), capable of reacting with the epoxy group in the curing agent (B). When there are less than 0.5 equivalents of active groups, the curing rate of the epoxy resin composition slows down, and the glass transition temperature of the obtained cured product drops, which may preclude achieving a sufficient modulus of elasticity. Beyond 1.2 equivalents of the above active groups, there occurs a loss of strength after curing.

When using the oligomer (G) singly as the epoxy resin (A), or when using concomitantly the oligomer (G) and the epoxy resin (A), the blending ratio of the epoxy resin (A) (or oligomer (G)) and the curing agent (B) is such that relative to 1 equivalent of epoxy groups in the epoxy resin (A) there are preferably 0.5 to 0.7 equivalents, more preferably 0.6 to 0.7 equivalents, of active groups (acid anhydride groups or hydroxyl groups), capable of reacting with the epoxy group, in the curing agent (B). When there are less than 0.5 equivalents of active groups, the curing rate of the epoxy resin composition slows down, and the glass transition temperature of the obtained cured product drops, which may preclude achieving a sufficient modulus of elasticity. Beyond 0.7 equivalents of the above active groups, there may occur loss of strength after curing. When the epoxy resin (A) comprises the oligomer (G), the number of equivalents of the curing agent (B) is converted from the sum of active groups, capable of reacting with the epoxy groups, comprised in the curing agent (B) and the curing agent (B'), taking as 1 equivalent the total amount of epoxy groups in the epoxy resin (A) and the epoxy resin (A') contained in the oligomer (G).

The thermosetting resin composition for light reflection of the present invention may optionally contain an appropriate compound as the curing accelerator (C). Examples thereof include, for instance, tertiary amines such as 1,8-diaza-bicyclo(5,4,0)undecene-7, triethylenediamine or tri-2,4,6-dimethylaminomethyl phenol; imidazoles such as 2-ethyl-4 methylimidazole and 2-methylimidazole; phosphorus compounds such as triphenyl phosphine, tetraphenyl phosphonium tetraphenylborate, tetra-n-butyl phosphonium-o,o-diethyl phosphorodithioate, tetra-n-butyl phosphonium tetrafluoroborate and tetra-n-butyl phosphonium tetraphenyl borate; quaternary ammonium salts; organic metal salts; as well as derivatives of the foregoing. The above curing accelerators may be used singly or concomitantly. Preferably used among the above curing accelerators are tertiary amines, imidazoles and phosphorus compounds.

The content of curing accelerator (C) is preferably 0.01 to 8.0 wt %, more preferably 0.1 to 3.0 wt % relative to the epoxy resin (A). A content of curing accelerator of less than 0.01 wt % may preclude achieving a sufficient curing acceleration effect, while a content in excess of 8.0 wt % may give rise to discoloration in the obtained molding.

With a view to adjusting the moldability thereof, the thermosetting resin composition for light reflection of the present invention comprises preferably an inorganic filler (D). The inorganic filler (D) used is not particularly limited, and may be for instance at least one inorganic filler selected from the group consisting of silica, aluminum hydroxide, magnesium hydroxide, barium sulfate, magnesium carbonate and barium carbonate. In terms of thermal conductivity, reflectance characteristics and moldability, the thermosetting resin composition for light reflection comprises preferably at least silica. Silica is preferably used in combination with aluminum hydroxide, in order to increase flame retardancy.

In an embodiment of the present invention, preferably, the inorganic filler (D) comprises a porous filler or a compound having oil absorption capacity. As the inorganic filler (D) there can be used a porous filler or at least one filler having oil absorbability selected from the group consisting of silica, aluminum hydroxide, magnesium hydroxide, barium sulfate, magnesium carbonate and barium carbonate. There can also be used a compound having a porous structure and, in addition, oil absorption capacity The shape of the porous filler or the compound having oil absorption capacity is not particularly limited, and may be, for instance, a spherical shape, an irregular shape, a disc-like shape, a rod shape or a fibrous shape. In consideration of fluidity in the mold during transfer molding, the shape is preferably a spherical shape or an irregular shape, more preferably a spherical shape.

A surface of the porous filler or compound having oil absorption capacity may be subjected to a chemical or physical hydrophilization treatment or hydrophobization treatment. Preferably, the surface is subjected to a hydrophobization treatment. More preferably, the surface is subjected to a hydrophobization treatment by chemical means in such a manner so as to achieve an oil absorption amount (amount defined in accordance with JIS K 5101) no smaller than 50 ml/100 g. Adherence with the epoxy resin (A) and the curing agent (B) is increased by using a porous filler or a compound having oil absorption capacity having the surface thereof subjected to a hydrophobization treatment. This increases as a result the mechanical strength of the thermally cured product and fluidity during transfer molding. Adherence with the epoxy resin (A) can be enhanced, and loss of pot life of the resin composition after kneading can be curtailed, by using a compound having oil absorption capacity or a porous filler having the surface thereof subjected to a hydrophobization treatment such that the oil absorption amount is no smaller than 50 ml/100 g. Coloration during heat curing can also be inhibited thereby. As the porous filler having undergone a hydrophobization treatment there may be used, for instance, Sylophobic 702, marketed by Fuji Silysia Chemical Ltd.

The apparent density of the porous filler or compound having oil absorption capacity is not particularly limited, but is preferably no smaller than 0.4 g/cm$^3$, more preferably of 0.4 to 2.0 g/cm$^3$. The apparent density takes into account the density occupied by the porous filler or compound having oil absorption capacity and the space (i.e. pore volume) taken up by small pores. When the apparent density is smaller than 0.4 g/cm$^3$, the mechanical strength of the filler particles is small, which may result in particle rupture on account of shear stress, as encountered in mixing ball mills or the like, during melt kneading. By contrast, an apparent density in excess of 2.0 g/cm$^3$ makes it likelier for the resin composition to adhere to a surface of the mold, which comprises a pot die and a plunger die, during molding of tablets for transfer molding.

In terms of packing efficiency with a white pigment, the average particle size of the porous filler or the compound having oil absorption capacity ranges preferably from 0.1 to 100 μm, and more preferably from 1 to 10 μm. An average particle size greater than 100 μm, or smaller than 0.1 μm, is likely to impair fluidity of the resin composition when the latter is melted during transfer molding.

The specific surface area of the porous filler of the compound having oil absorption capacity ranges preferably from 100 to 1000 m$^2$/g, more preferably from 300 to 700 m$^2$/g. When the specific surface area is smaller than 100 m$^2$/g, the amount of oil absorbed by the filler in the resin composition decreases, which tends to make the resin likelier to adhere to the plunger die during tablet molding. A specific surface greater than 1000 m$^2$/g tends to result in poorer fluidity of the resin composition when the latter is melted during transfer molding.

The content of porous filler or compound having oil absorption capacity is not particularly limited, but ranges preferably from 0.1 vol % to 20 vol % relative to total inorganic filler (D). In terms of moldability of the resin composition during melting, the content ranges more preferably from 1 vol % to 5 vol %. When the content is smaller than 0.1 vol %, part of the resin composition tends to adhere more readily to a surface of the pot and the plunger of the molding mold, while a content greater than 20 vol % tends to result in poorer fluidity of the resin composition when the latter is melted during transfer molding. When using for instance the above Sylophobic 702 as the porous filler, the content thereof is preferably no greater than 5 vol %, from the viewpoint of fluidity of the resin composition during melting and strength of the resin cured product.

The white pigment (E) used in the present invention is not particularly limited, and there can be employed a known white pigment. For instance, there can be used alumina, magnesium oxide, antimony oxide, titanium oxide, zirconium oxide or inorganic hollow particles, singly or in combination. Examples of inorganic hollow particles include, for instance, sodium silicate glass, aluminosilicate glass, sodium borosilicate soda glass, Shirasu glass or the like. In terms of heat conductivity and reflectance characteristics, the inorganic hollow particles used are preferably at least alumina or magnesium oxide, or a combination thereof. As regards particle size, the median particle size of the white pigment (E) ranges preferably from 0.1 to 50 μm. When the median particle size is smaller than 0.1 μm particles tend to aggregate readily, thereby impairing dispersibility. A median particle size beyond 50 μm, meanwhile, may preclude achieving sufficient reflectance characteristics in the cured product. The blending amount of the white pigment (E) is not particularly limited, but ranges preferably from 10 vol % to 85 vol % relative to total resin composition.

The total blending amount of the inorganic filler (D) and the white pigment (E) is not particularly limited, but ranges preferably from 10 vol % to 85 vol % relative to total resin composition. Sufficient reflectance characteristics in the cured product may fail to be achieved when this total blending amount of is smaller than 10 vol %. When the total bending amount exceeds 85 vol %, the moldability of the resin composition worsens, and it becomes harder to manufacture an optical semiconductor mounting substrate.

To the thermosetting resin composition for light reflection of the present invention there may be added a coupling agent (F), as the case may require. The coupling agent used (F) is not particularly limited, and may be, for instance, a silane coupling agent or a titanate coupling agent. Examples of the silane coupling agent that can be used include, for instance, epoxy silanes, amino silanes, cationic silanes, vinylsilanes, acrylsilanes, mercaptosylanes as well as complex systems of the foregoing. The type and treatment conditions of the coupling agent (F) are not particularly limited, and may be those of conventionally employed methods. For instance, the coupling agent (F) may be added as-is to the resin composition, or may be added having been mixed beforehand with the inorganic filler or the white pigment. The blending amount of coupling agent (F) is preferably no greater than 5 wt % relative to the resin composition.

A thickener (H) may also be added to the thermosetting resin composition for light reflection of the present invention, with a view to adjusting melt viscosity. The thickener (H) used is not particularly limited, but may be, for instance, nanosilica available in the form of Reolosil CP-102, marketed by Tokuyama Inc. The addition amount of thickener (H) is preferably no greater than 0.15 vol % relative to the total volume of the resin composition. When the addition amount of thickener (H) exceeds 0.15 vol %, fluidity of the resin composition during melting is impaired, and sufficient material strength after curing may fail to be obtained. The thickener (H) is preferably a nanoparticle filler such that the median particle size thereof ranges from 1 nm to 1000 nm. More preferably, the thickener (H) is a nanoparticle filler such that the median particle size thereof ranges from 10 nm to 1000 nm. A filler having a median particle size smaller than 1 nm results in particularly undesirable characteristics owing to the accompanying likelier particle aggregation and poorer dispersibility. When using such a thickener (H), nanosilica may be employed as part of the inorganic filler (D). Meanwhile, a filler having a median particle size greater than 1000 nm results in particularly undesirable characteristics, in terms of precluding reducing burr length. Other than the thickener (H), various other additives such as antioxidants, release agents or ion supplements may also be added to the resin composition of the present invention, as the case may require.

The thermosetting resin composition for light reflection of the present invention can be obtained by uniformly dispersing and mixing the above components. The preparation method, conditions and so forth are not particularly limited. An ordinary procedure may involve stirring and mixing predetermined amounts of the various components uniformly enough, using a mixer or the like, followed by kneading using for instance a mixing roll, an extrusion machine, a kneader, a roller or an extruder. The obtained kneaded product may then be cooled and ground. The kneading method is not particularly limited, but is preferably melt kneading. The melt kneading conditions, which are not particularly limited, may be appropriately decided in accordance with the types and blending amounts of the components used. For instance, melt kneading is carried out preferably at 15 to 100° C. for 5 to 40 minutes, more preferably at 20 to 100° C. for 10 to 30 minutes. When the temperature during melt kneading is below 15° C. the components are difficult to be melt-kneaded and dispersibility tends to decrease. By contrast, a temperature higher than 100° C. causes the molecular weight of the resin composition to increase, and may trigger curing of the resin composition. When the melt kneading time is shorter than 5 minutes, it is likelier that burr length fails to be curbed efficiently. A melt kneading time in excess of 40 minutes, meanwhile, causes the molecular weight of the resin composition to increase, and may trigger curing of the resin composition before molding.

After blending and kneading of the various components above, the thermosetting resin composition for light reflection of the present invention is preferably aged with a view to increasing melt viscosity during molding. More specifically, aging is preferably carried out at 0° C. to 30° C. for 1 to 72 hours. More preferably, aging is carried out at 15° C. to 30° C. for 12 to 72 hours, and yet more preferably at 25° C. to 30° C. for 24 to 72 hours. Aging carried out over a shorter time than 1 hour tends to preclude limiting burr length effectively, whereas aging carried out for more than 72 hours may preclude ensuring sufficient fluidity during transfer molding. When aging is carried out at a temperature below 0° C., the curing accelerator (C) may be inactivated and the three-dimensional cross-linking reaction of the resin composition may fail to progress sufficiently, whereupon viscosity may fail to rise during melting. Aging carried out at a temperature higher than 30° C. makes it likelier for the resin composition to absorb water, while the mechanical characteristics of the cured product, such as strength and modulus of elasticity, tend to be impaired.

The optical semiconductor element mounting substrate of the present invention is achieved using the thermosetting resin composition for light reflection of the present invention. Specifically, the optical semiconductor element mounting substrate of the present invention may be a substrate having one or more recesses constituting an optical semiconductor element mounting region, such that at least the inner peripheral side face of the recess comprises the thermosetting resin composition for light reflection of the present invention. FIG. 1(a) is a perspective-view diagram and FIG. 1(b) a side cross-sectional diagram illustrating an embodiment of an optical semiconductor element mounting substrate of the present invention.

Figure 1:
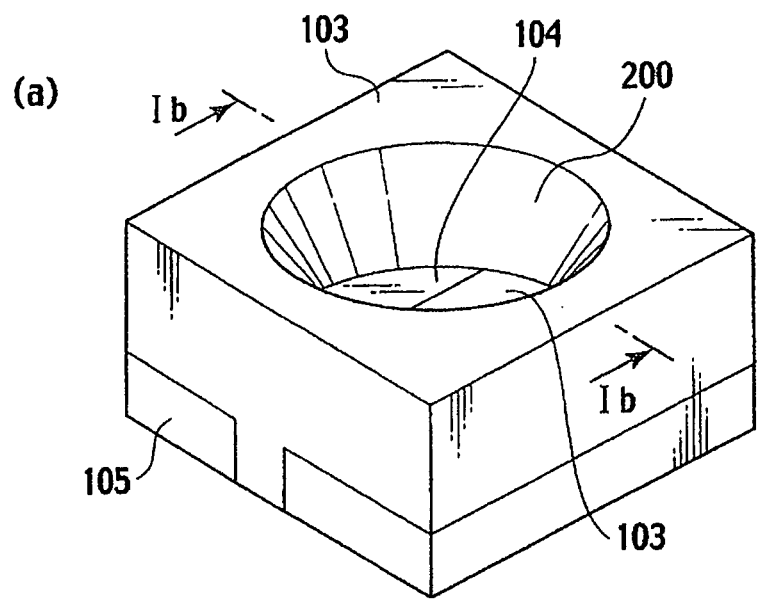
FIG. 1(a) is a perspective-view diagram and FIG. 1(b) is a side cross-sectional diagram illustrating an embodiment of an optical semiconductor element mounting substrate of the present invention.
Figure 1:
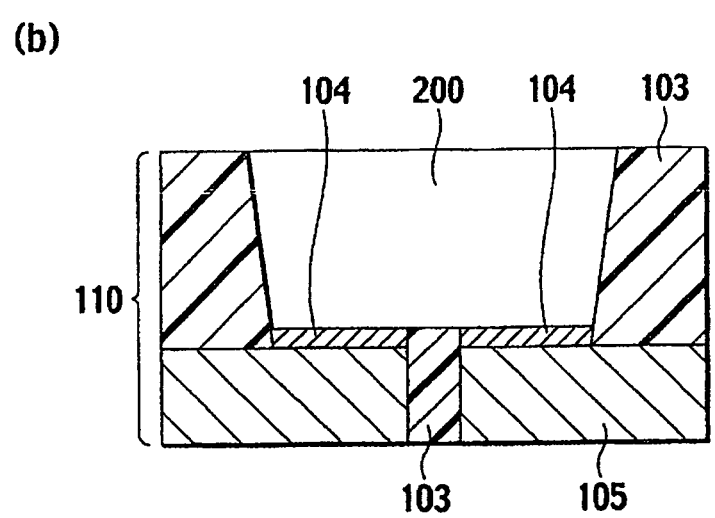

As illustrated in FIG. 1, an optical semiconductor element mounting substrate 110 of the present invention has a structure comprising a reflector 103 and a wiring pattern (lead frame) comprising a Ni/Ag plating 104 and metal wiring 105 integrated as a single unit, the optical semiconductor optical semiconductor element mounting substrate having formed therein a recess 200 that constitutes an optical semiconductor element mounting region. At least the inner peripheral side face of the recess 200 comprises the thermosetting resin composition for light reflection of the present invention.

Figure 2:
FIG. 2(a) through (c) are schematic diagrams for explaining respective steps in a method for manufacturing the optical semiconductor element mounting substrate of the present invention by transfer molding.
Figure 2:
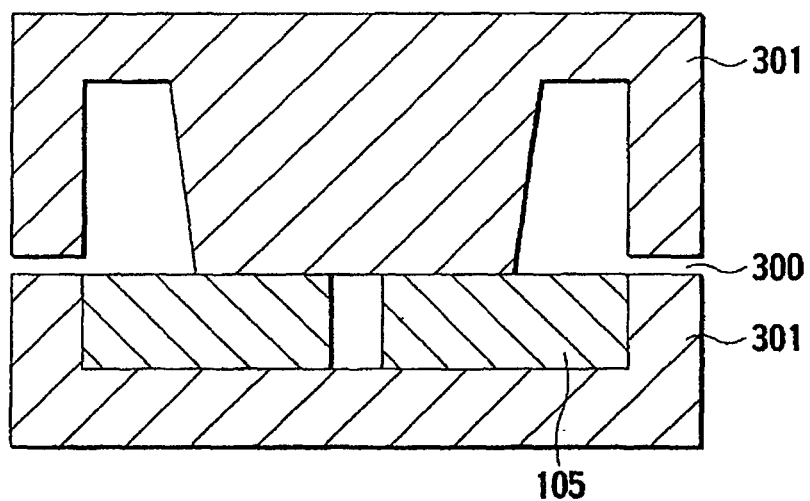
Figure 2:
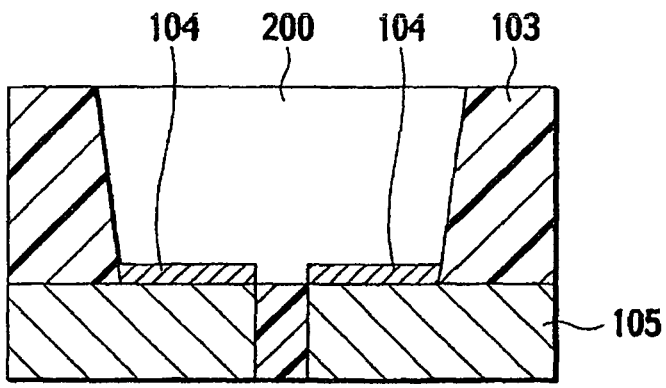

The method for manufacturing the optical semiconductor element mounting substrate of the present invention is not particularly limited, and may involve, for instance, transfer molding of the thermosetting resin composition for light reflection of the present invention or of a tablet molded product thereof. FIG. 2 is a set of schematic diagrams for explaining the method for manufacturing the optical semiconductor element mounting substrate of the present invention. FIGS. 2(a) through (c) correspond to respective steps in the manufacture of a substrate by transfer molding. More specifically, the optical semiconductor element mounting substrate of the present invention can be manufactured by forming the metal wiring 105 out of metal foil using a known method such as punching or electroless plating, as illustrated in FIG. 2(a). The metal wiring 105 is disposed next in a mold 301 having a predetermined shape (FIG. 2(b)), and then the thermosetting resin composition for light reflection (molten product of a tablet molding) of the present invention is infused into the mold 301 through a resin sprue 300. The infused resin composition is then cured, preferably, at a mold temperature of 170 to 190° C., under a molding pressure of 2 to 8 MP; for 60 to 120 seconds. Thereafter, the resulting molded product is removed from the mold 301, and is thermally cured at a post-cure temperature of 120° C. to 180° C. for 1 to 3 hours. Next, the Ni/Ag plating 104 is applied at a predetermined position of the recess 200, which forms the optical semiconductor element mounting region, so as to surround the periphery of the reflector 103 that comprises the cured thermosetting resin composition for light reflection (FIG. 2(c)).

Figure 3:
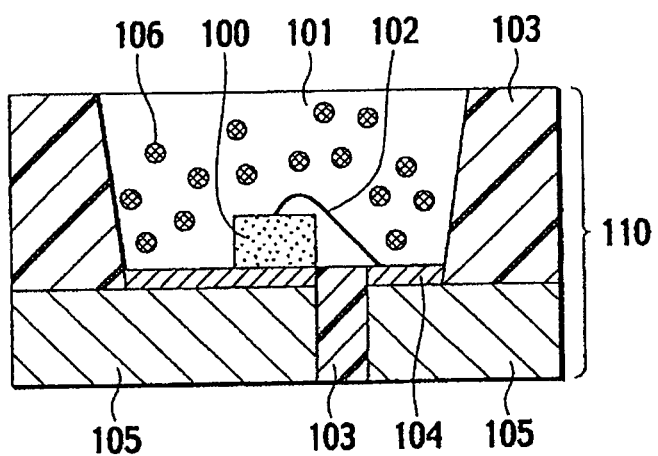
FIGS. 3(a) and 3(b) are side-view cross-sectional diagrams illustrating schematically the structure of one embodiment of an optical semiconductor device of the present invention.
Figure 3:
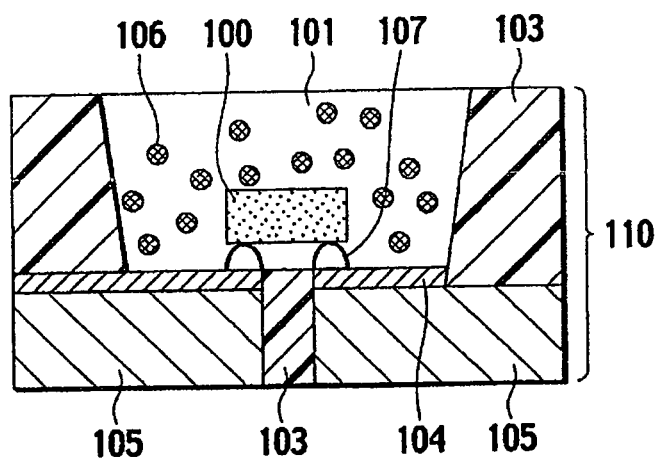

The optical semiconductor device using the optical semiconductor element mounting substrate of the present invention comprises at least the optical semiconductor element mounting substrate of the present invention, an optical semiconductor element mounted on the recess bottom face of the optical semiconductor element mounting substrate, and a phosphor-containing transparent encapsulating resin layer formed inside the recess in such a manner so as to cover the optical semiconductor element. FIG. 3(a) and FIG. 3(b) are side-view cross-sectional diagrams illustrating one embodiment of the optical semiconductor device of the present invention. More specifically, the optical semiconductor device illustrated in FIG. 3 comprises an optical semiconductor element 100 mounted at a predetermined position of the bottom of the recess (denoted by the reference numeral 200 in FIG. 2), as the optical semiconductor element mounting region of the optical semiconductor element mounting substrate 110 of the present invention. The optical semiconductor element 100 and the metal wiring 105 are electrically connected using known methods, such as a bonding wire 102 or solder bumps 107, via the Ni/Ag plating 104. The optical semiconductor element 100 is covered by a transparent encapsulating resin 101 comprising a known phosphor 106.

EXAMPLES

The present invention is explained in more detail below on the basis of examples, although the invention is in no way meant to be limited to or by these examples. The components used in the examples and comparative examples are detailed below.

*1: Triglycidyl isocyanurate (epoxy equivalent 100, trade name TEPIC-S, Nissan Chemical Industries Ltd.)

*2: Hexahydrophthalic anhydride (Wake Pure Chemical Industries)

*3: 1,3,5-tris(3-carboxypropyl)isocyanurate (C3CIC acid, Shikoku Chemicals Corporation)

*4: Cyclohexanetricarboxylic anhydride (Mitsubishi Gas Chemical Company, Inc., trade name H-TMAn)

*5: Tetrahydrophthalic anhydride (Aldrich)

*6: Methylhydrophthalic anhydride (Hitachi Chemical Co. Ltd., trade name HN5500)

*7: Tetra-n-butyl phosphonium-o,o-diethyl phosphorodithioate (Nippon Chemical Industrial Co. Ltd., trade name PX-4ET)

*8: Trimethoxyepoxysilane (Down Corning Toray Co. Ltd., trade name SH6040)

*9: Fatty acid ester (Clariant Ltd., trade name Hoechst wax E)

*10: Aliphatic ether (Toyo Petrolite Co. Ltd., trade name Unitox 420)

*11: Fused silica (Denki Kagaku Kogyo, trade name FB-301)

*12: Fused silica (Denki Kagaku Kogyo, trade name FB-950)

*13: Fused silica (Admatechs Co. Ltd., trade name SO-25R)

*14: Porous spherical silica (Fuji Silysia Chemical Ltd., trade name Sylosphere C-1504), average particle size: 3 μm, apparent density: 0.58 g/ml, specific surface area: 300 m$^2$/g)

*15: Porous indefinite-shape silica (Fuji Silysia Chemical Ltd., trade name Sylophobic 702), average particle size 4 μm, apparent density: 0.48 g/ml, specific surface area: 300 m$^2$/g)

*16: Porous indefinite-shape silica (Fuji Silysia Chemical Ltd., trade name Silysia 430), average particle size, trade name Silysia 430, average particle size: 4 pin, apparent density: 0.48 g/ml, specific surface area: 300 m$^2$/g)

*17: Hollow particles (Sumitomo 3M Ltd., trade name S60-HS)

*18: Alumina (Admatechs Co. Ltd., trade name AO-802)

*19: Nanosilica (Tokuyama Inc., CP-102)

Examples A1 to A16, Comparative Examples A1 to A7

1. Preparation of the Thermosetting Resin Composition for Light Reflection

Components were blended in the blending proportions given in Table A1 through Table A3 below. After thorough kneading in a mixer, the resulting blends were melt-kneaded under predetermined conditions, using a mixing roll, to yield kneaded products. The obtained kneaded products were ground to yield the thermosetting resin compositions for light reflection of Examples A1 to A16, Comparative examples A1 to A7. The blending amount units of the components in Tables A1 to A3 are parts by weight. The blanks in the tables indicate that the corresponding component was not blended in the composition.

2. Evaluation of the Thermosetting Resin Composition for Light Reflection

The light reflectance and the burr length of the various resin compositions of Examples A1 to A16 and Comparative examples A1 to A7 thus prepared were measured in accordance with the methods below. The wire bondability of substrates obtained by molding the various resin compositions was also examined and evaluated. The results are given in Tables A1 to A3.

(Light Reflectance)

The thermosetting resin compositions for light reflection prepared above were transfer-molded at a molding mold temperature of 180° C., a molding pressure of 6.9 MPa, and a curing time of 90 seconds, followed by post-curing at 150° C. for 2 hours, to yield specimens 1.0 mm thick. The light reflectance of the various specimens was measured at a wavelength of 400 nm using a V-750 integrating sphere spectrophotometer (Jasco Corp.).

(Burr Length)

The thermosetting resin compositions for light reflection prepared above were infused into a mold for burr measurement (see FIG. 4), using a pot, and were then cured to yield moldings of the resin compositions. The mold temperature during molding was 180° C., the molding pressure of 6.9 MPa, the resin infusion time (transfer time) was 10 seconds, the curing temperature was 180° C. and the curing time was 90 seconds.

After molding, the upper die of the mold for burr measurement was removed, and the maximum value of the length of the burrs generated during molding on account of flow into the gaps between the upper die and the lower die was measured using a caliper.

Figure 5:
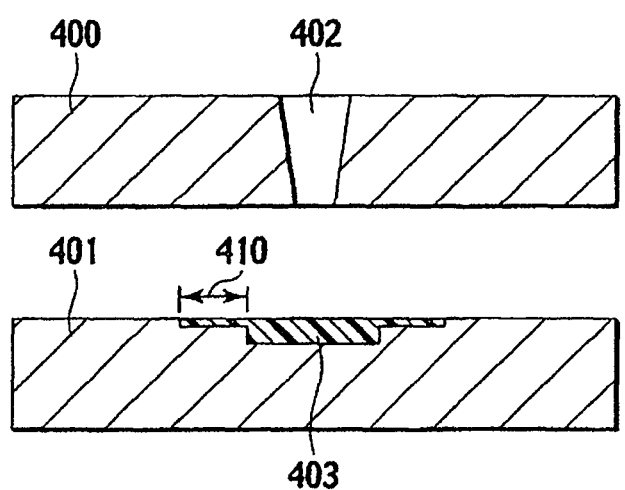
FIG. 5(a) is a side-view cross-sectional diagram and FIG. 5(b) a plan-view diagram illustrating schematically burrs formed during molding using the mold for burr measurement illustrated in FIG. 4.
Figure 5:
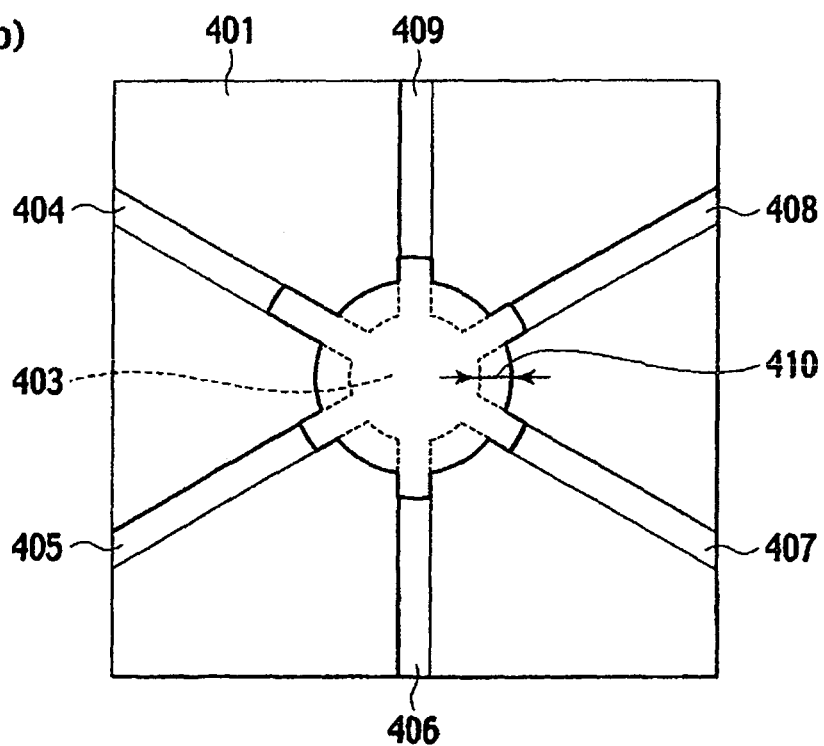

FIG. 4(a) is a side-view cross-sectional diagram and FIG. 4(b) a plan-view diagram illustrating schematically the structure of the mold for burr measurement used for measuring the above burr length. As illustrated in FIG. 4, the mold for burr measurement comprises a pair of dies i.e. an upper die 400 and a lower die 401, the upper die 400 having a resin sprue 402. The lower die 401 comprises a cavity 403 opposing the resin sprue 402, and six slits 404, 405, 406, 407, 408 and 409 extending from the cavity 403 towards the outer periphery of the mold. The dimensions of the mold for burr measurement actually used were 140 mm×140 mm for the outer shape of the upper die 400 and the lower die 401, an upper diameter of 7 mm and a lower diameter of 4 mm for the resin sprue 402, and a diameter of 30 mm and a depth of 4 mm for the cavity 403, as illustrated in FIG. 4. The width of the six slits 404 to 409 extending from the cavity 403 was 5 mm, and the depths 75, 50, 30, 20, 10 and 2 μm, in this order. FIG. 5(a) is a side-view cross-sectional diagram and FIG. 5(b) a plan-view diagram illustrating schematically the burrs formed during molding using the mold for burr measurement illustrated in FIG. 4. As illustrated in FIG. 5, burrs denote herein portions 410 into which the resin composition flows and is the cured, beyond the outer edge of the cavity 403, along the slits. The "burr length" specified in the present invention is the maximum value of the burrs designated by reference numeral 410, measured using a caliper.

(Evaluation of Wire Bondability)

Firstly, optical semiconductor element mounting substrates were manufactured by transfer molding in accordance with the manufacturing process illustrated in FIG. 2 using the various thermosetting resin compositions for light reflection prepared above. The molding conditions were a molding mold temperature of 180° C., a molding pressure of 6.9 MPa and a curing time of 90 seconds, followed by post-curing at 150° C. for 2 hours.

Next, an optical semiconductor element was mounted on the substrates thus prepared, on the recess that constitutes the optical semiconductor element mounting region. Thereafter, the optical semiconductor element was electrically connected to the substrate by wire bonding, using a wire bonder (trade name HW22 U-H, by Kyushu Matsushita Electric Co. Ltd.) and a bonding wire having a diameter of 28 μm. The heating temperature of the substrates during wire bonding was 180° C. Wire bondability was evaluated in accordance with the evaluation criteria below, on the basis of tensile strength values of the wires for wire bonding that electrically connect the optical semiconductor element to the substrate, as measured using a pull tester PTR-01 (trade name, by Rhesca Co. Ltd.).

Evaluation Criteria of Wire Bondability
A: Tensile strength of 10 g or more
B: Tensile strength of not less than 4 g to less than 10 g
C: Tensile strength of less than 4 g
D: Unbondable

TABLE A1

| | | Item | | Examples A 1 | 2 | 3 | 4 | 5 | 6 | 7 | 8 |
|---|---|---|---|---|---|---|---|---|---|---|---|
| Blend Components | (A) | Trisglycidyl isocyanurate | (*1) | 100 | 100 | 100 | 100 | 100 | 100 | 100 | 100 |
| | (B) | Hexahydrophthalic anhydride | (*2) | 123 | 123 | 123 | 123 | 123 | 123 | 123 | 123 |
| | | C3ClC acid | (*3) | | | | | | | | |
| | | Cyclohexane tricarboxylic anhydride | (*4) | | | | | | | | |
| | | Tetrahydrophthalic anhydride | (*5) | | | | | | | | |
| | | Methylhexahydrophthalic anhydride | (*6) | | | | | | | | |
| | | (Number of equivalents corresponding to 1 equivalent of epoxy groups) | | (0.8) | (0.8) | (0.8) | (0.8) | (0.8) | (0.8) | (0.8) | (0.8) |
| | (C) | Tetra-n-butylphosphonium-o,o-diethyl phosphorodithioate | (*7) | 1.0 | 1.0 | 1.0 | 1.0 | 1.0 | 1.0 | 1.0 | 1.0 |
| | (F) | Trimethoxyepoxysilane | (*8) | 9.4 | 10.9 | 11.6 | 10.0 | 10.9 | 11.6 | 10.0 | 10.9 |
| | Release agent | Fatty acid ester | (*9) | 1.0 | 1.0 | 1.0 | 1.0 | 1.0 | 1.0 | 1.0 | 1.0 |
| | | Aliphatic ether | (*10) | 1.0 | 1.0 | 1.0 | 1.0 | 1.0 | 1.0 | 1.0 | 1.0 |
| | (D) | Fused spherical silica 1 (median particle size 6 μm) | (*11) | 519 | 606 | 675 | 519 | 606 | 675 | 519 | 606 |
| | | Fused spherical silica 2 (median particle size 20 μm) | (*12) | | | | | | | | |
| | | Fused spherical silica 3 (median particle size 0.6 μm) | (*13) | | | | | | | | |
| | | Porous spherical silica | (*14) | 47 | 23 | 5 | | | | | |
| | | Porous indefinite-shape silica Surface hydrophobized | (*15) | | | | 47 | 23 | 5 | | |
| | | Porous indefinite-shape silica Surface untreated | (*16) | | | | | | | 47 | 23 |
| | (E) | Hollow particles (median particle size 27 μm) | (*17) | 189 | 189 | 189 | 189 | 189 | 189 | 189 | 189 |
| | | Alumina (median particle size 1 μm) | (*18) | 613 | 613 | 613 | 613 | 613 | 613 | 613 | 613 |
| (G) | (A') | Trisglycidyl isocyanurate | (*1) | | | | | | | | |
| | (B') | Hexahydrophthalic anhydride (Number of equivalents corresponding to 1 equivalent of epoxy groups) | (*2) | | | | | | | | |
| | (C') | Tetra-n-butyl phosphonium-o,o-diethyl phosphorodithioate | (*7) | | | | | | | | |

TABLE A1-continued

|  | Item |  | \multicolumn{8}{c}{Examples A} |
|---|---|---|---|---|---|---|---|---|---|---|
|  |  |  | 1 | 2 | 3 | 4 | 5 | 6 | 7 | 8 |
| Thickener | Nanosilica (median particle size 5 nm) | (*19) | | | | | | | | |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

TABLE A2

|  |  | Item |  | \multicolumn{8}{c}{Examples A} |
|---|---|---|---|---|---|---|---|---|---|---|---|
|  |  |  |  | 9 | 10 | 11 | 12 | 13 | 14 | 15 | 16 |
| Blend Components | (A) | Trisglycidyl isocyanurate | (*1) | 100 | 100 | 100 | 100 | 100 | 100 | 100 | 100 |
|  | (B) | Hexahydrophthalic anhydride | (*2) | 123 | 123 | 123 | 123 | 123 | 123 | 123 | 123 |
|  |  | C3ClC acid | (*3) | | | | | | | | |
|  |  | Cyclohexane tricarboxylic anhydride | (*4) | | | | | | | | |
|  |  | Tetrahydrophthalic anhydride | (*5) | | | | | | | | |
|  |  | Methylhexahydrophthalic anhydride | (*6) | | | | | | | | |
|  |  | (Number of equivalents corresponding to 1 equivalent of epoxy groups) |  | (0.8) | (0.8) | (0.8) | (0.8) | (0.8) | (0.8) | (0.8) | (0.8) |
|  | (C) | Tetra-n-butylphosphonium-o,o-diethyl phosphorodithioate | (*7) | 1.0 | 1.0 | 1.0 | 1.0 | 1.0 | 1.0 | 1.0 | 1.0 |
|  | (F) | Trimethoxyepoxysilane | (*8) | 9.4 | 10.9 | 11.6 | 10.0 | 10.9 | 11.6 | 10.0 | 10.9 |
|  | Release agent | Fatty acid ester | (*9) | 1.0 | 1.0 | 1.0 | 1.0 | 1.0 | 1.0 | 1.0 | 1.0 |
|  |  | Aliphatic ether | (*10) | 1.0 | 1.0 | 1.0 | 1.0 | 1.0 | 1.0 | 1.0 | 1.0 |
|  | (D) | Fused spherical silica 1 (median particle size 6 μm) | (*11) | 519 | 645 | 719 | 553 | 645 | 719 | 553 | 645 |
|  |  | Fused spherical silica 2 (median particle size 20 μm) | (*12) | | | | | | | | |
|  |  | Fused spherical silica 3 (median particle size 0.6 μm) | (*13) | | | | | | | | |
|  |  | Porous spherical silica | (*14) | 47 | 23 | 5 | | | | | |
|  |  | Porous indefinite-shape silica Surface hydrophobized | (*15) | | | | 47 | 23 | 5 | | |
|  |  | Porous indefinite-shape silica Surface untreated | (*16) | | | | | | | 47 | 23 |
|  | (E) | Hollow particles (median particle size 27 μm) | (*17) | 201 | 201 | 201 | 201 | 201 | 201 | 201 | 201 |
|  |  | Alumina (median particle size 1 μm) | (*18) | 613 | 613 | 654 | 654 | 654 | 654 | 654 | 654 |
| (G) | (A') | Trisglycidyl isocyanurate | (*1) | | | | | | | | |
|  | (B') | Hexahydrophthalic anhydride (Number of equivalents corresponding to 1 equivalent of epoxy groups) | (*2) | | | | | | | | |
|  | (C') | Tetra-n-butyl phosphonium-o,o-diethyl phosphorodithioate | (*7) | | | | | | | | |
| Thickener |  | Nanosilica (median particle size 5 nm) | (*19) | | | | | | | | |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

TABLE A3

| | Item | | | Comparative examples A 1 | 2 | 3 | 4 | 5 | 6 | 7 |
|---|---|---|---|---|---|---|---|---|---|---|
| Blend Components | (A) | Trisglycidyl isocyanurate | (*1) | 100 | 100 | 100 | 100 | 100 | 100 | 100 |
| | (B) | Hexahydrophthalic anhydride | (*2) | 123.4 | 123.4 | 123.4 | 123.4 | 123.4 | 138.6 | 154.0 |
| | | C3ClC acid | (*3) | | | | | | | |
| | | Cyclohexane tricarboxylic anhydride | (*4) | | | | | | | |
| | | Tetrahydrophthalic anhydride | (*5) | | | | | | | |
| | | Methylhexahydrophthalic anhydride | (*6) | | | | | | | |
| | | (Number of equivalents corresponding to 1 equivalent of epoxy groups) | | (0.8) | (0.8) | (0.8) | (0.8) | (0.8) | (0.9) | (0.10) |
| | (C) | Tetra-n-butylphosphonium-o,o-diethyl phosphorodithioate | (*7) | 1.0 | 1.0 | 1.0 | 1.0 | 1.0 | 1.0 | 1.0 |
| | (F) | Trimethoxyepoxysilane | (*8) | 9.38 | 10.2 | 10.9 | 9.38 | 10.2 | 10.9 | 9.38 |
| | Release agent | Fatty acid ester | (*9) | 1.0 | 1.0 | 1.0 | 1.0 | 1.0 | 1.0 | 1.0 |
| | | Aliphatic ether | (*10) | 1.0 | 1.0 | 1.0 | 1.0 | 1.0 | 1.0 | 1.0 |
| | (D) | Fused spherical silica 1 (median particle size 6 μm) | (*11) | 681 | 511 | 340 | 170 | | | |
| | | Fused spherical silica 2 (median particle size 20 μm) | (*12) | | | | | 1362 | 1454 | 1546 |
| | | Fused spherical silica 3 (median particle size 0.6 μm) | (*13) | | 170 | 340 | 511 | | | |
| | | Porous spherical silica | (*14) | | | | | | | |
| | | Porous indefinite-shape silica Surface hydrophobized | (*15) | | | | | | | |
| | | Porous indefinite-shape silica Surface untreated | (*16) | | | | | | | |
| | (E) | Hollow particles (median particle size 27 μm) | (*17) | 189 | 189 | 189 | 189 | | | |
| | | Alumina (median particle size 1 μm) | (*18) | 613 | 613 | 613 | 613 | 613 | 613 | 613 |
| | (G) (A') | Trisglycidyl isocyanurate | (*1) | | | | | | | |
| | (B') | Hexahydrophthalic anhydride (Number of equivalents corresponding to 1 equivalent of epoxy groups) | (*2) | | | | | | | |
| | (C') | Tetra-n-butyl phosphonium-o,o-diethyl phosphorodithioate | (*7) | | | | | | | |
| | Thickener | Nanosilica (median particle size 5 nm) | (*19) | | | | | | | |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

As Table A1 to Table A3 show, the resin compositions of Examples A1 to A16 exhibit excellent light reflectance characteristics and excellent wire bondability. Burr length at the time of transfer molding was also limited. Therefore, a step of removing resin contamination becomes unnecessary when manufacturing an optical semiconductor element mounting substrate or an optical semiconductor device using the thermosetting resin composition for light reflection of the present invention. This is extremely advantageous from the viewpoint of productivity as regards costs, manufacturing time and the like.

Examples B1 to B11, Comparative Examples B1 to B8

1. Preparation of the Thermosetting Resin Composition for Light Reflection

Components were blended in the blending proportions given in Table B1 and Table 132 below. After thorough kneading in a mixer, the resulting products were melt-kneaded under predetermined conditions, using a mixing roll, to yield kneaded products. The obtained kneaded products were aged, as needed, were cooled and were then ground to prepare thereby the thermosetting resin compositions for light reflection of Examples B1 to B11 and Comparative examples B1 to B8.

The blending amount units of the components in Tables B1 and B2 are parts by weight. The blanks in the tables indicate that the corresponding component was not blended in the composition, or that the corresponding step was not carried out. Details of the examples are as follows.

Example B1 relates to a technique in which a specific oligomer (G) is used.

Example B2 relates to a technique in which there are 0.5 to 0.7 equivalents of active groups in the curing agent per equivalent of epoxy groups in the epoxy resin (A).

Example B3 relates to a technique in which a nano-filler is added as the thickener (H).

Example B4 relates to a technique in which the resin composition is aged under predetermined conditions.

Example B5 relates to a technique in which melt kneading conditions are adjusted (kneading time prolonged from 15 minutes to 30 minutes).

Examples B6 to B11 relate to instances in which two among the above-described techniques are used concomitantly.

The oligomer (G) used in Examples B1, B6, B7 and B9 was prepared in accordance with the below-described procedure.

The viscosity of the oligomer (G) was 1000 mPa·s, for a sample amount of 0.155±0.01 g, measured at 100° C. using an ICI cone/plate viscometer manufactured by Research Equipment LTD (London).

(Method for Manufacturing the Oligomer)

Components were blended according to the blending conditions given in Table B1 and were melt-kneaded at 25° C. for 10 minutes in a mixing roll. The blending proportions given in Table B1 are such so that there are 0.1 equivalents of acid anhydride per equivalent of epoxy groups. The clay-like compositions (kneaded product) obtained by melt kneading were then aged at a temperature of 55° C. for 4 hours.

After aging, the kneaded products were ground down to a particle size no greater than 1 mm using an earthenware mortar having an opening diameter of 300 mm, to yield desired oligomers. The obtained oligomers were stored in an environment at a temperature not higher than 0° C.

2. Evaluation of the Thermosetting Resin Composition for Light Reflection

The light reflectance and burr length of the thermosetting resin compositions for light reflection of Examples B1 to B6 and Comparative examples B1 to B8 thus prepared were measured in the same way as in the examples above. The wire bondability of substrates obtained through molding of respective resin compositions was measured in the same way as in the examples above, and was evaluated in accordance with the criteria below. The results are given in Tables B1 and B2.

Evaluation Criteria of Wire Bondability
A: Tensile strength of 10 g or more
B: Tensile strength of not less than 4 g to less than 10 g
C: Tensile strength of less than 4 g
D: Unbondable

TABLE B1

| | | Item | | Examples B 1 | 2 | 3 | 4 | 5 | 6 |
|---|---|---|---|---|---|---|---|---|---|
| Blend Components | (A) | Trisglycidyl isocyanurate | (*1) | | 100 | 100 | 100 | 100 | |
| | (B) | Hexahydrophthalic anhydride | (*2) | 123 | 108 | 139 | 139 | 139 | 92.4 |
| | | C3CIC acid | (*3) | | | | | | |
| | | Cyclohexane tricarboxylic anhydride | (*4) | | | | | | |
| | | Tetrahydrophthalic anhydride | (*5) | | | | | | |
| | | Methylhexahydrophthalic anhydride | (*6) | | | | | | |
| | | (Number of equivalents corresponding to 1 equivalent of epoxy groups) | | (0.8) | (0.7) | (0.9) | (0.9) | (0.9) | (0.6) |
| | (C) | Tetra-n-butylphosphonium-o,o-diethyl phosphorodithioate | (*7) | 1.2 | 2.4 | 2.4 | 2.4 | 2.4 | 1.2 |
| | (F) | Trimethoxyepoxysilane | (*8) | 16.2 | 14.2 | 15.8 | 16.2 | 16.2 | 16 |
| | Release agent | Fatty acid ester | (*9) | 4.8 | 4.2 | 4.8 | 4.8 | 4.8 | 4.2 |
| | | Aliphatic ether | (*10) | 2.4 | 2.1 | 2.4 | 2.4 | 2.4 | 2.1 |
| | (D) | Fused spherical silica 1 (median particle size 6 μm) | (*11) | 796 | 693 | 795 | 796 | 796 | 698 |
| | | Fused spherical silica 2 (median particle size 20 μm) | (*12) | | | | | | |
| | | Fused spherical silica 3 (median particle size 0.6 μm) | (*13) | | | | | | |
| | | Porous spherical silica | (*14) | | | | | | |
| | | Porous indefinite-shape silica Surface hydrophobized | (*15) | | | | | | |
| | | Porous indefinite-shape silica Surface untreated | (*16) | | | | | | |
| | (E) | Hollow particles (median particle size 27 μm) | (*17) | 217 | 189 | 217 | 217 | 217 | 190 |
| | | Alumina (median particle size 1 μm) | (*18) | 705 | 615 | 669 | 705 | 705 | 619 |
| | (G) (A') | Trisglycidyl isocyanurate | (*1) | 100 | | | | | 100 |
| | (B') | Hexahydrophthalic anhydride | (*2) | 15.4 | | | | | 15.4 |
| | | (Number of equivalents corresponding to 1 equivalent of epoxy groups) | | (0.1) | | | | | (0.1) |
| | (C') | Tetra-n-butyl phosphonium-o,o-diethyl phosphorodithioate | (*7) | 1.2 | | | | | 1.2 |
| | Thickener | Nanosilica (median particle size 5 nm) | (*19) | | | 20 | | | |

| | | Item | | Examples B 7 | 8 | 9 | 10 | 11 |
|---|---|---|---|---|---|---|---|---|
| Blend Components | (A) | Trisglycidyl isocyanurate | (*1) | | 100 | | 100 | 100 |
| | (B) | Hexahydrophthalic anhydride | (*2) | 123 | 108 | 123 | 108 | 139 |
| | | C3CIC acid | (*3) | | | | | |
| | | Cyclohexane tricarboxylic anhydride | (*4) | | | | | |
| | | Tetrahydrophthalic anhydride | (*5) | | | | | |
| | | Methylhexahydrophthalic anhydride | (*6) | | | | | |
| | | (Number of equivalents corresponding to 1 equivalent of epoxy groups) | | (0.8) | (0.7) | (0.8) | (0.7) | (0.9) |
| | (C) | Tetra-n-butylphosphonium-o,o-diethyl phosphorodithioate | (*7) | 1.2 | 2.4 | 1.2 | 2.4 | 2.4 |
| | (F) | Trimethoxyepoxysilane | (*8) | 15.8 | 13.8 | 16.2 | 14.2 | 15.8 |
| | Release agent | Fatty acid ester | (*9) | 4.8 | 4.2 | 4.8 | 4.2 | 4.8 |
| | | Aliphatic ether | (*10) | 2.4 | 2.1 | 2.4 | 2.1 | 2.4 |
| | (D) | Fused spherical silica 1 (median particle size 6 μm) | (*11) | 795 | 692 | 796 | 693 | 795 |

TABLE B1-continued

|  |  | Item |  | Examples B 1 | 2 | 3 | 4 | 5 | 6 |
|---|---|---|---|---|---|---|---|---|---|
|  |  | Fused spherical silica 2 (median particle size 20 μm) | (*12) |  |  |  |  |  |  |
|  |  | Fused spherical silica 3 (median particle size 0.6 μm) | (*13) |  |  |  |  |  |  |
|  |  | Porous spherical silica | (*14) |  |  |  |  |  |  |
|  |  | Porous indefinite-shape silica Surface hydrophobized | (*15) |  |  |  |  |  |  |
|  |  | Porous indefinite-shape silica Surface untreated | (*16) |  |  |  |  |  |  |
| (E) |  | Hollow particles (median particle size 27 μm) | (*17) | 217 | 189 | 217 | 189 | 217 |  |
|  |  | Alumina (median particle size 1 μm) | (*18) | 795 | 692 | 705 | 615 | 669 |  |
| (G) | (A') | Trisglycidyl isocyanurate | (*1) | 100 |  | 100 |  |  |  |
|  | (B') | Hexahydrophthalic anhydride (Number of equivalents corresponding to 1 equivalent of epoxy groups) | (*2) | 15.4 (0.1) |  | 15.4 (0.1) |  |  |  |
|  | (C') | Tetra-n-butyl phosphonium-o,o-diethyl phosphorodithioate | (*7) | 1.2 |  | 1.2 |  |  |  |
| Thickener |  | Nanosilica (median particle size 5 nm) | (*19) | 20 | 20 |  |  | 20 |  |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

TABLE B2

|  |  | Item |  | Comparative Examples B 1 | 2 | 3 | 4 | 5 | 6 | 7 | 8 |
|---|---|---|---|---|---|---|---|---|---|---|---|
| Blend Components | (A) | Trisglycidyl isocyanurate | (*1) | 100 | 100 | 100 | 100 | 100 | 100 | 100 | 100 |
|  | (B) | Hexahydrophthalic anhydride | (*2) | 139 | 139 | 69.4 |  | 69.4 |  | 123 | 135 |
|  |  | C3CIC acid | (*3) |  |  |  |  |  |  |  |  |
|  |  | Cyclohexane tricarboxylic anhydride | (*4) |  |  |  |  |  |  |  |  |
|  |  | Tetrahydrophthalic anhydride | (*5) |  |  | 67.6 | 135 |  |  |  |  |
|  |  | Methylhexahydrophthalic anhydride | (*6) |  |  |  |  | 75 | 150 |  |  |
|  |  | (Number of equivalents corresponding to 1 equivalent of epoxy groups) |  | (0.9) | (0.9) | (0.9) | (0.9) | (0.9) | (0.9) | (0.8) | (0.9) |
|  | (C) | Tetra-n-butylphosphonium-o,o-diethyl phosphorodithioate | (*7) | 2.4 | 2.4 | 2.4 | 2.4 | 2.4 | 2.4 | 1.0 | 1.0 |
|  | (F) | Trimethoxyepoxysilane | (*8) | 16.2 | 10.7 | 10.6 | 10.5 | 10.5 | 10.5 | 10.5 | 10.5 |
|  | Release agent | Fatty acid ester | (*9) | 4.8 | 4.8 | 4.8 | 4.8 | 4.8 | 4.8 | 4.8 | 4.8 |
|  |  | Aliphatic ether | (*10) | 2.4 | 2.4 | 2.4 | 2.4 | 2.4 | 2.4 | 2.4 | 2.4 |
|  | (D) | Fused spherical silica 1 (median particle size 6 μm) | (*11) | 796 |  |  |  |  |  | 796 | 796 |
|  |  | Fused spherical silica 2 (median particle size 20 μm) | (*12) |  | 1558 | 1558 | 1558 | 1558 | 1558 |  |  |
|  |  | Fused spherical silica 3 (median particle size 0.6 μm) | (*13) |  | 390 | 390 | 390 | 390 | 390 |  |  |
|  |  | Porous spherical silica | (*14) |  |  |  |  |  |  |  |  |
|  |  | Porous indefinite-shape silica Surface hydrophobized | (*15) |  |  |  |  |  |  |  |  |
|  |  | Porous indefinite-shape silica Surface untreated | (*16) |  |  |  |  |  |  |  |  |
|  | (E) | Hollow particles (median particle size 27 μm) | (*17) | 217 |  |  |  |  |  | 217 | 217 |
|  |  | Alumina (median particle size 1 μm) | (*18) | 705 |  |  |  |  |  | 705 | 705 |
|  | (G) (A') | Trisglycidyl isocyanurate | (*1) |  |  |  |  |  |  |  |  |
|  | (B') | Hexahydrophthalic anhydride (Number of equivalents corresponding to 1 equivalent of epoxy groups) | (*2) |  |  |  |  |  |  |  |  |
|  | (C') | Tetra-n-butyl phosphonium-o,o-diethyl phosphorodithioate | (*7) |  |  |  |  |  |  |  |  |

TABLE B2-continued

|  |  | Item |  | \multicolumn{8}{c}{Comparative Examples B} |
|---|---|---|---|---|---|---|---|---|---|---|---|
|  |  |  |  | 1 | 2 | 3 | 4 | 5 | 6 | 7 | 8 |
|  | Thickener | Nanosilica (median particle size 5 nm) | (*19) |  |  |  |  |  |  |  |  |
| Manufacturing method | Kneading conditions | Kneading temperature (° C.) |  | 25 | 25 | 25 | 25 | 25 | 25 | 25 | 25 |
|  |  | Kneading time (min) |  | 15 | 15 | 15 | 15 | 15 | 15 | 15 | 15 |
|  | Aging conditions | Temperature (° C.) Time (h) |  |  |  |  |  |  |  |  |  |
| Characteristics | Light reflectance (%) |  |  | 91.1 | 60.3 | 51.6 | 43.5 | 65.2 | 64.1 | 92.2 | 95 |
|  | Burr length (mm) |  |  | 10.3 | 15.1 | 16.4 | 18.3 | 15.1 | 17.9 | 12.1 | 11.8 |
|  | Wire bondability (180° C.) |  |  | D | D | D | D | D | D | D | D |

Note:
(A) Epoxy resin;
(B) Curing agent;
(C) Curing catalyst;
(D) Inorganic filler;
(E) White pigment;
(F) Coupling agent;
(G) Oligomer
(A') Epoxy resin;
(B') Curing agent;
(C') Curing catalyst.

As Tables B1 and B2 show, the thermosetting resin compositions for light reflection of Examples B1 to B11 exhibit excellent light reflectance characteristics and excellent wire bondability. Burr length at the time of transfer molding was also limited. Therefore, a step of removing resin contamination becomes unnecessary when manufacturing an optical semiconductor element mounting substrate or an optical semiconductor device using the thermosetting resin composition for light reflection of the present invention. This is extremely advantageous from the viewpoint of productivity as regards costs, manufacturing time and the like. It is also possible to reduce the amount of residual monomer component when the oligomer (G) is used. In addition to enhancing wire bondability, this allows avoiding as a result problems such as mold contamination during molding and loss of releasability of the molded article, and affords a molded substrate having excellent appearance.

Examples C1 to C3 and Comparative Examples C1, C2

1. Preparation of the Thermosetting Resin Composition for Light Reflection

Components were blended in the blending proportions given in Table C1 below. After thorough kneading in a mixer, the resulting products were melt-kneaded under predetermined conditions, using a mixing roll, to yield kneaded products. The obtained kneaded products were cooled to room temperature and were ground to prepare the various thermosetting resin compositions for light reflection of Examples C1 to C3 and Comparative examples C1 and C2. The blending amount units of the components in Table C1 are parts by weight. The blanks in the tables indicate that the corresponding component was not blended in the composition.

2. Evaluation of the Thermosetting Resin Composition for Light Reflection

The light reflectance and burr length of the thermosetting resin compositions for light reflection of Examples C1 to C3 and Comparative examples C1, C2 thus prepared were measured in the same way as in the examples above. The wire bondability of substrates obtained through molding of respective resin compositions was measured in the same way as in the examples above, and was evaluated in accordance with the criteria below. The results are given in Table C1.

Evaluation Criteria of Wire Bondability
A: Tensile strength of 10 g or more
B: Tensile strength of not less than 4 g to less than 10 g
C: Tensile strength of less than 4 g
D: Unbondable

TABLE C1

|  |  | Item |  | \multicolumn{3}{c}{Examples C} | \multicolumn{2}{c}{Com. Examples C} |
|---|---|---|---|---|---|---|---|---|
|  |  |  |  | 1 | 2 | 3 | 1 | 2 |
| Blend Components | (A) | Trisglycidyl isocyanurate | (*1) | 100 | 100 | 100 | 100 | 100 |
|  | (B) | Hexahydrophthalic anhydride | (*2) | 77 | 100 | 115 | 139 |  |
|  |  | C3CIC acid | (*3) | 65 | 45 | 32 |  | 129 |
|  |  | Cyclohexane tricarboxylic anhydride | (*4) |  |  |  |  |  |
|  |  | Tetrahydrophthalic anhydride | (*5) |  |  |  |  |  |
|  |  | Methylhexahydrophthalic anhydride | (*6) |  |  |  |  |  |
|  |  | (Number of equivalents corresponding to 1 equivalent of epoxy groups) |  | (0.9) | (0.9) | (0.9) | (0.9) | (0.9) |
|  | (C) | Tetra-n-butylphosphonium-o,o-diethyl phosphorodithioate | (*7) | 2.4 | 2.5 | 2.5 | 2.4 | 2.3 |

TABLE C1-continued

|  | Item |  | \multicolumn{3}{c|}{Examples C} | \multicolumn{2}{c}{Com. Examples C} |
|  |  |  | 1 | 2 | 3 | 1 | 2 |
|---|---|---|---|---|---|---|---|
| (F) | Trimethoxyepoxysilane | (*8) | 18 | 18 | 18 | 20 | 24 |
| Release | Fatty acid ester | (*9) | 5.0 | 5.0 | 5.0 | 5 | 4.5 |
| agent | Aliphatic ether | (*10) | 2.5 | 2.5 | 2.4 | 2.5 | 2.5 |
| (D) | Fused spherical silica 1 (median particle size 6 μm) | (*11) | 809 | 819 | 878 | 811 | 793 |
|  | Fused spherical silica 2 (median particle size 20 μm) | (*12) |  |  |  |  |  |
|  | Fused spherical silica 3 (median particle size 0.6 μm) | (*13) |  |  |  |  |  |
|  | Porous spherical silica | (*14) |  |  |  |  |  |
|  | Porous indefinite-shape silica Surface hydrophobized | (*15) |  |  |  |  |  |
|  | Porous indefinite-shape silica Surface untreated | (*16) |  |  |  |  |  |
| (E) | Hollow particles (median particle size 27 μm) | (*17) | 220 | 224 | 239 | 250 | 216 |
|  | Alumina (median particle size 1 μm) | (*18) | 717 | 726 | 778 | 902 | 702 |
| (G) (A') | Trisglycidyl isocyanurate | (*1) |  |  |  |  |  |
| (B') | Hexahydrophthalic anhydride (Number of equivalents corresponding to 1 equivalent of epoxy groups) | (*2) |  |  |  |  |  |
| (C') | Tetra-n-butyl phosphonium-o,o-diethyl phosphorodithioate | (*7) |  |  |  |  |  |
| Thickener | Nanosilica (median particle size 5 nm) | (*19) |  |  |  |  |  |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

Note: (*) Measurement was not possible on account of deficient resin flow in the mold.

As Table C1 shows, the thermosetting resin compositions for light reflection of Examples C1 to C3 exhibit excellent light reflectance characteristics and excellent wire bondability. Burr length at the time of transfer molding was also limited. It is clear that thanks to its chemical structure, C3CIC acid not only allows increasing the mechanical strength of the moldings but is also effective in suppressing burrs in the moldings. However, the fluidity of compositions using C3CIC acid alone as the curing agent tends to be poor, and hence it is found that C3CIC acid is preferably used in combination with another curing agent such as HHPA. A step of removing resin contamination becomes thus unnecessary when manufacturing an optical semiconductor element mounting substrate or an optical semiconductor device using the thermosetting resin composition for light reflection of the present invention. This is extremely advantageous from the viewpoint of productivity as regards costs, manufacturing time and the like.

Examples D1 to D5 and Comparative Examples D1 to D3

1. Preparation of the Thermosetting Resin Composition for Light Reflection

Components were blended in the blending proportions given in Table D1 below. After thorough kneading in a mixer, the resulting products were melt-kneaded under predetermined conditions, using a mixing roll, to yield kneaded products. The obtained kneaded products were cooled to room temperature and were ground to prepare the various thermosetting resin compositions for light reflection of Examples D1 to D5 and Comparative examples D1 to D3. The blending amount units of the components in Table D1 are parts by weight. The blanks in the tables indicate that the corresponding component was not blended in the composition.

2. Evaluation of the Thermosetting Resin Composition for Light Reflection

The light reflectance and burr length of the thermosetting resin compositions for light reflection of Examples D1 to D5 and Comparative examples D1 to D3 thus prepared were measured in the same way as in the examples above. To assess durability, the light reflectance measurement was carried out after molding of the specimens and after heating at 150° C. for 72 hours. The wire bondability of substrates obtained through molding of respective resin compositions was measured in the same way as in the examples above, and was evaluated in accordance with the criteria below. The results are given in Table D1.

Evaluation Criteria of Wire Bondability

A: Tensile strength of 10 g or more
B: Tensile strength of not less than 4 g to less than 10 g
C: Tensile strength of less than 4 g
D: Unbondable

TABLE D1

| | | Item | | Examples D 1 | 2 | 3 | 4 | 5 | Com. Examples D 1 | 2 | 3 |
|---|---|---|---|---|---|---|---|---|---|---|---|
| Blend Components | (A) | Trisglycidyl isocyanurate | (*1) | 100 | 100 | 100 | 100 | 100 | 100 | 100 | 100 |
| | (B) | Hexahydrophthalic anhydride | (*2) | | 22 | 34 | | 34 | 139 | 139 | 127 |
| | | C3CIC acid | (*3) | | | | | | | | |
| | | Cyclohexane tricarboxylic anhydride | (*4) | 59 | 50 | 45 | 59 | 45 | | | 5 |
| | | Tetrahydrophthalic anhydride | (*5) | | | | | | | | |
| | | Methylhexahydrophthalic anhydride | (*6) | | | | | | | | |
| | | (Number of equivalents corresponding to 1 equivalent of epoxy groups) | | (0.9) | (0.9) | (0.9) | (0.9) | (0.9) | (0.9) | (0.9) | (0.9) |
| | (C) | Tetra-n-butylphosphonium-o,o-diethyl phosphorodithioate | (*7) | | | | 2.5 | 2.5 | | 2.5 | 2.5 |
| | (F) | Trimethoxyepoxysilane | (*8) | 20 | 20 | 20 | 20 | 20 | 20 | 20 | 20 |
| | Release agent | Fatty acid ester | (*9) | | | | | | | | |
| | | Aliphatic ether | (*10) | 2.5 | 2.5 | 2.5 | 2.5 | 2.5 | 2.5 | 2.5 | 2.5 |
| | (D) | Fused spherical silica 1 (median particle size 6 μm) | (*11) | 547 | 585 | 605 | 547 | 605 | 786 | 786 | 765 |
| | | Fused spherical silica 2 (median particle size 20 μm) | (*12) | | | | | | | | |
| | | Fused spherical silica 3 (median particle size 0.6 μm) | (*13) | | | | | | | | |
| | | Porous spherical silica | (*14) | | | | | | | | |
| | | Porous indefinite-shape silica Surface hydrophobized | (*15) | | | | | | | | |
| | | Porous indefinite-shape silica Surface untreated | (*16) | | | | | | | | |
| | (E) | Hollow particles (median particle size 27 μm) | (*17) | 149 | 160 | 165 | 149 | 165 | 214 | 214 | 209 |
| | | Alumina (median particle size 1 μm) | (*18) | 485 | 518 | 536 | 485 | 536 | 696 | 696 | 678 |
| | (G) (A') | Trisglycidyl isocyanurate | (*1) | | | | | | | | |
| | (B') | Hexahydrophthalic anhydride (Number of equivalents corresponding to 1 equivalent of epoxy groups) | (*2) | | | | | | | | |
| | (C') | Tetra-n-butyl phosphonium-o,o-diethyl phosphorodithioate | (*7) | | | | | | | | |
| | Thickener | Nanosilica (median particle size 5 nm) | (*19) | | | | | | | | |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

As Table D1 shows, the thermosetting resin compositions for light reflection of Examples D1 to D5 exhibit excellent light reflectance characteristics and excellent wire bondability. Burr length at the time of transfer molding was also limited. The light reflectance characteristic of the cured products (molded substrates), moreover, is not easily impaired. Therefore, a step of removing resin contamination becomes unnecessary when manufacturing an optical semiconductor element mounting substrate or an optical semiconductor device using the thermosetting resin composition for light reflection of the present invention. This is extremely advantageous from the viewpoint of productivity as regards costs, manufacturing time and the like. This shows that using the thermosetting resin composition for light reflection of the present invention allows manufacturing, with good efficiency, an optical semiconductor element mounting substrate capable of maintaining high reflectance from visible light to near infrared.

Examples E1 to E8

Components were blended in the blending proportions given in Table E1 below. After thorough kneading in a mixer, the resulting products were melt-kneaded under predetermined conditions, using a mixing roll, to yield kneaded products. The obtained kneaded products were cooled to room temperature and were ground to prepare the various thermosetting resin compositions for light reflection of Examples E1 to E8. Details on the components given in Table E1 are identical to those explained above. The blending amount units are parts by weight.

The light reflectance and burr length of the thermosetting resin compositions for light reflection of Examples E1 to E8 thus prepared were measured in the same way as in the examples above. The wire bondability of substrates obtained through molding of respective resin compositions was measured in the same way as in the examples above, and was evaluated in accordance with the criteria below. The results are given in Table E1.

Evaluation Criteria of Wire Bondability
A: Tensile strength of 10 g or more
B: Tensile strength of not less than 4 g to less than 10 g
C: Tensile strength of less than 4 g
D: Unbondable combinations. Therefore, a step of removing resin contamination becomes unnecessary when manufacturing an optical semiconductor element mounting substrate or an optical semiconductor device using the thermosetting resin composition for light reflection of the present invention. This is extremely advantageous from the viewpoint of productivity as regards costs, manufacturing time and the like.

It is obvious from the above explanation that the above embodiments can be subject to numerous modifications without departing from the spirit and scope of the present invention. Other than for the limitations set forth in the claims, therefore, the present invention is not restricted to any specific embodiments thereof.

TABLE E1

| | | Item | | Examples E 1 | 2 | 3 | 4 | 5 | 6 | 7 | 8 |
|---|---|---|---|---|---|---|---|---|---|---|---|
| Blend Components | (A) | Trisglycidyl isocyanurate | (*1) | 100 | 100 | 100 | 100 | 100 | 100 | 100 | 100 |
| | (B) | Hexahydrophthalic anhydride | (*2) | 115 | 100 | 22 | 34 | 115 | 100 | 22 | 34 |
| | | C3CIC acid | (*3) | 32 | 45 | | | 32 | 45 | | |
| | | Cyclohexane tricarboxylic anhydride | (*4) | | | 50 | 45 | | | 50 | 45 |
| | | Tetrahydrophthalic anhydride | (*5) | | | | | | | | |
| | | Methylhexahydrophthalic anhydride | (*6) | | | | | | | | |
| | | (Number of equivalents corresponding to 1 equivalent of epoxy groups) | | (0.9) | (0.9) | (0.9) | (0.9) | (0.9) | (0.9) | (0.9) | (0.9) |
| | (C) | Tetra-n-butylphosphonium-o,o-diethyl phosphorodithioate | (*7) | 2.5 | 2.5 | 2.5 | 2.5 | 2.5 | 2.5 | 2.5 | 2.5 |
| | (F) | Trimethoxyepoxysilane | (*8) | 18 | 18 | 20 | 20 | 18 | 18 | 20 | 20 |
| | Release agent | Fatty acid ester | (*8) | 1.0 | 1.0 | 1.0 | 1.0 | 1.0 | 1.0 | 1.0 | 1.0 |
| | | Aliphatic ether | (*10) | 1.0 | 1.0 | 1.0 | 1.0 | 1.0 | 1.0 | 1.0 | 1.0 |
| | (D) | Fused spherical silica 1 (median particle size 6 μm) | (*11) | 878 | 819 | 585 | 605 | 878 | 819 | 585 | 605 |
| | | Fused spherical silica 2 (median particle size 20 μm) | (*12) | | | | | | | | |
| | | Fused spherical silica 3 (median particle size 0.6 μm) | (*13) | | | | | | | | |
| | | Porous spherical silica | (*14) | | | | | | | | |
| | | Porous indefinite-shape silica Surface hydrophobized | (*15) | | | | | 5 | 5 | 5 | 5 |
| | | Porous indefinite-shape silica Surface untreated | (*16) | | | | | | | | |
| | (E) | Hollow particles (median particle size 27 μm) | (*17) | 239 | 224 | 160 | 165 | 239 | 224 | 160 | 165 |
| | | Alumina (median particle size 1 μm) | (*18) | 778 | 726 | 518 | 536 | 778 | 726 | 518 | 536 |
| (G) | (A') | Trisglycidyl isocyanurate | (*1) | | | | | | | | |
| | (B') | Hexahydrophthalic anhydride (Number of equivalents corresponding to 1 equivalent of epoxy groups) | (*2) | | | | | | | | |
| | (C') | Tetra-n-butyl phosphonium-o,o-diethyl phosphorodithioate | (*7) | | | | | | | | |
| Thickener | | Nanosilica (median particle size 5 nm) | (*19) | 20 | 20 | 20 | 20 | | | | |

Note:
(A) Epoxy resin;
(B) Curing agent;
(C) Curing accelerator;
(D) Inorganic filler;
(E) White pigment;
(F) Coupling agent;
(G) Oligomer
(A') Epoxy resin;
(B') Curing agent;
(C') Curing accelerator.

As Table E1 shows, the thermosetting resin compositions for light reflection of Examples E1 to E8 exhibit excellent light reflectance characteristics and yet superior wire bondability, with a high suppressing effect of burrs during transfer molding. Wire bondability can thus be further enhanced by blending the above constituent components in appropriate

The invention claimed is:
1. A thermosetting resin composition for light reflection, comprising a thermosetting component and a white pigment (E), wherein:
the thermosetting resin composition has a property of light reflectance at a wavelength of 350 nm to 800 nm, after thermal curing, which is not lower than 80%, and wherein:
the thermosetting component contains an epoxy resin (A) and a curing agent (B) containing an acid anhydride;
said white pigment (E) includes a mixture of inorganic hollow particles and at least one selected from the group consisting of alumina, magnesium oxide, antimony oxide, titanium oxide, and zirconium oxide; and
wherein the inorganic hollow particles are made of at least one selected from the group consisting of sodium silicate glass, aluminosilicate glass, sodium borosilicate soda glass and Shirasu glass;
the thermosetting resin composition comprises a kneaded product obtained under a condition where constituent components are kneaded at a kneading temperature of 20 to 100° C. for a kneading time of 10 to 30 minutes; and
said kneaded product is aged at 0 to 30° C. for 1 to 72 hours after the kneading.

2. The thermosetting resin composition for light reflection according to claim 1, further containing a thickener (H), wherein the thickener (H) contains a nanoparticle filler having a median particle size of 1 nm to 1000 nm.

3. The thermosetting resin composition for light reflection according to claim 1, further containing an inorganic filler (D), wherein the inorganic filler (D) contains a porous filler or a compound having oil absorption capacity.

4. The thermosetting resin composition for light reflection according to claim 3, wherein the shape of said porous filler or compound having oil absorption capacity is at least one selected from the group consisting of a perfect spherical shape, an irregular shape, a disc-like shape, a rod shape and a fibrous shape.

5. The thermosetting resin composition for light reflection according to claim 3, wherein a surface of said porous filler or compound having oil absorption capacity is subjected to a hydrophobization treatment or a hydrophilization treatment.

6. The thermosetting resin composition for light reflection according to claim 3, wherein the apparent density of said porous filler or compound having oil absorption capacity is not lower than 0.4 g/cm$^3$.

7. The thermosetting resin composition for light reflection according to claim 3, wherein the content of said porous filler or compound having oil absorption capacity in said inorganic filler (D) ranges from 0.1 vol % to 20 vol %.

8. The thermosetting resin composition for light reflection according to claim 3, further containing as said inorganic filler (D), at least one selected from the group consisting of silica, aluminum hydroxide, magnesium hydroxide, barium sulfate, magnesium carbonate and barium carbonate.

9. The thermosetting resin composition for light reflection according to claim 1, wherein the median particle size of said white pigment (E) ranges from 0.1 to 50 μm.

10. The thermosetting resin composition for light reflection according to claim 3, wherein the total blending amount of said inorganic filler (D) and said white pigment (E) ranges from 10 vol % to 85 vol % relative to total resin composition.

11. The thermosetting resin composition for light reflection according to claim 1, wherein said light reflectance at a wavelength of 350 nm to 800 nm, after thermal curing, is not lower than 90%.

12. The thermosetting resin composition for light reflection according to claim 1, which is capable of being pressure molded at a temperature in the range of 0° C. to 30° C. prior to thermal curing.

13. The thermosetting resin composition for light reflection according to claim 1, further including an inorganic filler (D).

14. The thermosetting resin composition for light reflection according to claim 13, wherein a total blending amount of the inorganic filler (D) and the white pigment (E) ranges from 10 vol % to 85 vol % relative to total resin composition.

15. The thermosetting resin composition for light reflection according to claim 1, wherein said curing agent (B) contains hexahydrophthalic anhydride.

16. The thermosetting resin composition for light reflection according to claim 1, wherein the epoxy resin (A) contains at least one selected from the group consisting of bisphenol A epoxy resins, bisphenol F epoxy resins, bisphenol S epoxy resins, diglycidyl isocyanurate and triglycidyl isocyanurate.

17. The thermosetting resin composition for light reflection according to claim 1, wherein the curing agent (B) contains at least one selected from the group consisting of phthalic anhydride, maleic anhydride, trimellitic anhydride, pyromellitic dianhydride, hexahydrophthalic anhydride, tetrahydrophthalic anhydride, methyl nadic anhydride, nadic anhydride, glutaric anhydride, dimethylglutaric anhydride, diethylglutaric anhydride, succinic anhydride, methylhexahydrophthalic anhydride and methyltetrahydrophthalic anhydride.

18. The thermosetting resin composition for light reflection according to claim 1, wherein said white pigment (E) includes a mixture of inorganic hollow particles, alumina and at least one selected from the group consisting of magnesium oxide, antimony oxide, titanium oxide and zirconium oxide.

19. The thermosetting resin composition for light reflection according to claim 1, wherein a blending amount of the white pigment (E) is 10 vol % to 85 vol % relative to the total thermosetting resin composition.

20. The thermosetting resin composition for light reflection according to claim 1, wherein said kneading is a melt kneading.

* * * * *